US012787525B2

(12) United States Patent
Lin

(10) Patent No.: US 12,787,525 B2
(45) Date of Patent: Nov. 3, 2026

(54) DISPLAY DEVICE AND MANUFACTURING METHOD THEREOF

(71) Applicant: AUO Corporation, Hsinchu (TW)

(72) Inventor: Shih-Hsiung Lin, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 359 days.

(21) Appl. No.: 18/544,445

(22) Filed: Dec. 19, 2023

(65) Prior Publication Data

US 2025/0169253 A1 May 22, 2025

(30) Foreign Application Priority Data

Nov. 20, 2023 (TW) ................................ 112144710

(51) Int. Cl.
*H10H 20/857* (2025.01)
*H10W 90/00* (2026.01)
*H10H 20/01* (2025.01)

(52) U.S. Cl.
CPC .......... *H10H 20/857* (2025.01); *H10W 90/00* (2026.01); *H10H 20/0364* (2025.01)

(58) Field of Classification Search
CPC .. H10H 20/857; H10H 20/0364; H10W 90/00
See application file for complete search history.

(56) References Cited

U.S. PATENT DOCUMENTS

| | | | | |
|---|---|---|---|---|
| 10,121,710 | B2 * | 11/2018 | Chang | H10P 74/232 |
| 11,641,010 | B2 | 5/2023 | Hsieh et al. | |
| 12,062,748 | B2 | 8/2024 | Hsieh et al. | |
| 12,100,793 | B2 | 9/2024 | Hsieh et al. | |
| 2020/0152827 | A1 * | 5/2020 | Chen | H10W 72/90 |
| 2021/0193894 | A1 | 6/2021 | You et al. | |
| 2022/0028924 | A1 | 1/2022 | Lin et al. | |
| 2022/0029051 | A1 | 1/2022 | Lin et al. | |

FOREIGN PATENT DOCUMENTS

| | | |
|---|---|---|
| CN | 214203161 | 9/2021 |
| TW | I763476 | 5/2022 |
| TW | 202310442 | 3/2023 |

* cited by examiner

*Primary Examiner* — Douglas M Menz
(74) *Attorney, Agent, or Firm* — JCIPRNET

(57) ABSTRACT

A display device includes a circuit substrate and first to third light-emitting elements. The circuit substrate has first to third sub-pixels. Each of the first to third sub-pixels has a first bonding area and a second bonding area. The first light-emitting element is located in the first bonding area of the first sub-pixel, and is bonded to the circuit substrate through a first solder structure. The second light-emitting element is located in the second sub-pixel. There is first residual solder on the first bonding area of the second sub-pixel. The third light-emitting element is located on one of the first bonding area and the second bonding area of the third sub-pixel, and is bonded to the circuit substrate through a conductive adhesive structure.

16 Claims, 29 Drawing Sheets

DISPLAY DEVICE AND MANUFACTURING METHOD THEREOF

CROSS-REFERENCE TO RELATED APPLICATION

This application claims the priority benefit of Taiwan application serial no. 112144710, filed on Nov. 20, 2023. The entirety of the above-mentioned patent application is hereby incorporated by reference herein and made a part of this specification.

BACKGROUND

Technical Field

The disclosure relates to a display device and a manufacturing method thereof.

Description of Related Art

A light emitting diode (LED), as an electroluminescent semiconductor device, has advantages of high efficiency, long life, fast response, and high reliability. Generally speaking, the key technology for manufacturing a micro LED display lies in how to effectively transfer a large number of micro LEDs to a circuit substrate. However, the transfer technology involves mechanical operations, and effectiveness thereof depends on accuracy of an apparatus as well as accuracy and a yield of a transfer process.

When extracting the micro LEDs, it may be affected by machine operation errors and accuracy errors of a transfer device. Similarly, when the micro LEDs are placed on a substrate, they are also subject to alignment errors due to a machine operation. If the micro LEDs are not placed correctly or suffer damage during transfer and placement processes, the micro LEDs will not function properly. Typically, a repair process is required to repair pixels that are not functioning properly. Therefore, many manufacturers are currently committed to developing a method that may improve a yield of the repair process.

SUMMARY

The disclosure provides a display device that has an advantage of less defective pixels through a repair process.

At least one embodiment of the disclosure provides a display device including a circuit substrate, a first light-emitting element, a second light-emitting element, and a third light-emitting element. The circuit substrate has a first sub-pixel, a second sub-pixel, and a third sub-pixel. Each of the first sub-pixel, the second sub-pixel, and the third sub-pixel has a first bonding area and a second bonding area. The first light-emitting element is located in the first bonding area of the first sub-pixel, and is bonded to the circuit substrate through a first solder structure. The second light-emitting element is located in the second sub-pixel. The third light-emitting element is located on one of the first bonding area and the second bonding area of the third sub-pixel, and is bonded to the circuit substrate through a first conductive adhesive structure.

At least one embodiment of the disclosure provides a manufacturing method of a display device including the following steps. A circuit substrate is provided. The circuit substrate has a first sub-pixel, a second sub-pixel, and a third sub-pixel, and each of the first sub-pixel, the second sub-pixel, and the third sub-pixel has a first bonding area and a second bonding area. Multiple first light-emitting elements are respectively disposed on the first sub-pixel, the second sub-pixel, and the third sub-pixel. One of the first light-emitting elements is disposed on the first bonding area of the first sub-pixel and is bonded to the circuit substrate through a first solder structure, and another ones of the first light-emitting elements are respectively disposed on the second sub-pixel and the third sub-pixel. The another ones of the first light-emitting elements are removed, and a first residual solder is left on the first bonding area of the second sub-pixel. A second residual solder is left on the first bonding area of the third sub-pixel. Multiple second light-emitting elements are respectively disposed on the second sub-pixel and the third sub-pixel. One of the second light-emitting elements is disposed on the second bonding area of the second sub-pixel and is bonded to the circuit substrate through a second solder structure, and another one of the second light-emitting elements is disposed on the third sub-pixel. The another one of the second light-emitting elements is removed, and a third residual solder is left on the second bonding area of the third sub-pixel. A third light-emitting element is disposed on the third sub-pixel. The third light-emitting element is connected to the circuit substrate through a first conductive adhesive structure.

DETAILED DESCRIPTION OF DISCLOSED EMBODIMENTS

FIGS. 1A to 8C are various views of a manufacturing method of a display device 10' according to an embodiment of the disclosure. Specifically, FIGS. 1A to 2C are schematic views of a manufacturing method of a display device 10. When it is found that some pixels in the display device 10 are faulty, a repair process shown in FIGS. 3A to 8C may be adopted to obtain a repaired display device 10'''.

Figures 1A, 1B, 1C:
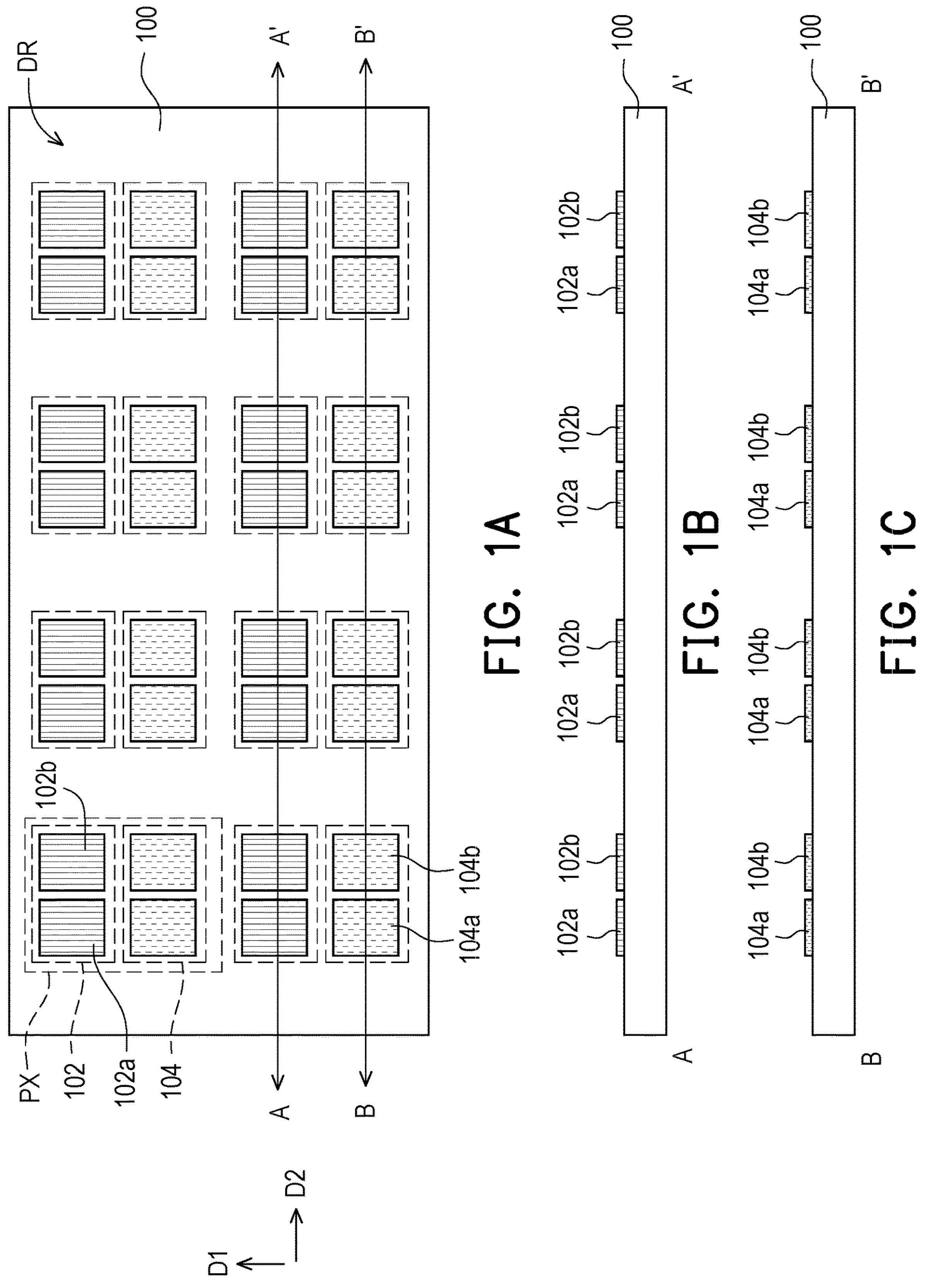
FIGS. 1A, 2A, 3A, 4A, 5A, 6A, 7A, and 8A are schematic top views of a manufacturing method of a display device according to an embodiment of the disclosure.
FIGS. 1B, 2B, 3B, 4B, 5B, 6B, 7B, and 8B are schematic cross-sectional views taken along a line A-A' in FIGS. 1A, 2A, 3A, 4A, 5A, 6A, 7A, and 8A respectively.
FIGS. 1C, 2C, 3C, 4C, 5C, 6C, 7C, and 8C are schematic cross-sectional views taken along a line B-B' in FIGS. 1A, 2A, 3A, 4A, 5A, 6A, 7A, and 8A respectively.

Referring to FIGS. 1A to 1C, a circuit substrate 100 is provided. The circuit substrate 100 has multiple sub-pixels PX, and each of the sub-pixels PX has a first bonding area 102 and a second bonding area 104. For example, the circuit substrate 100 includes a substrate and a circuit structure located on the substrate. The circuit structure includes a pad, a wire, an active device, a passive device, and other suitable components. FIGS. 1A to 1C show a first pad 102*a* and a second pad 102*b* in the first bonding area 102 and a first repair pad 104*a* and a second repair pad 104*b* in the second bonding area 104, and other circuit structures in the circuit substrate 100 are omitted. The first bonding area 102 and the second bonding area 104 are disposed in a display area DR of the circuit substrate 100.

Figure 9:
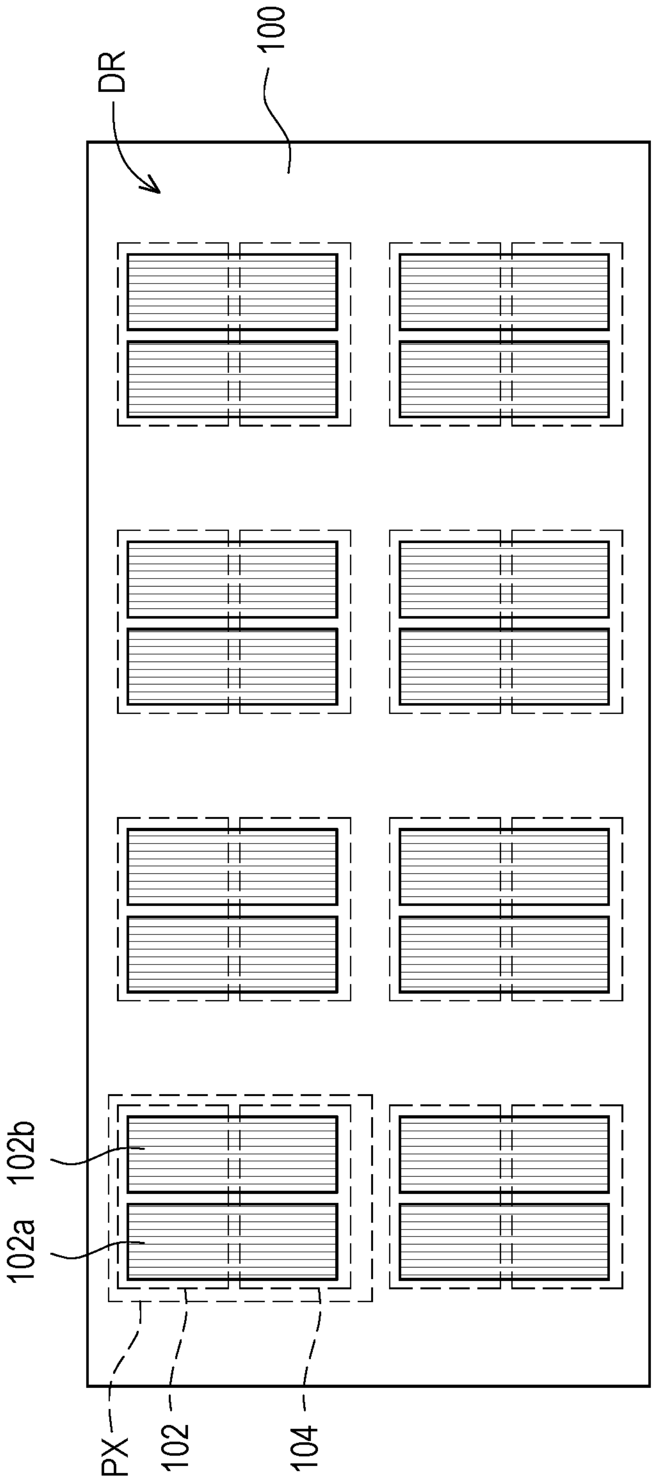
FIG. 9 is a schematic top view of a circuit substrate according to an embodiment of the disclosure.

In this embodiment, the first bonding area 102 includes the first pad 102*a* and the second pad 102*b* that are separated from each other, and the second bonding area 104 includes the first repair pad 104*a* and the second repair pad 104*b* that are separated from each other. The first pad 102*a* is electrically connected to the first repair pad 104*a*, and the second pad 102*b* is electrically connected to the second repair pad 104*b*. In some embodiments, the first pad 102*a* of the first bonding area 102 and the first repair pad 104*a* of the second bonding area 104 are electrically connected to each other through other wires (not shown) or circuit structures. Similarly, the second pad 102*b* of the first bonding area 102 and the second repair pad 104*b* of the second bonding area 104 are electrically connected to each other through other wires (not shown) or circuit structures. In other embodiments, the first pad 102*a* in the first bonding area 102 extends continuously from the first bonding area 102 to the second bonding area 104, and the second pad 102*b* in the first bonding area 102 also extends continuously from the first bonding area 102 to the second bonding area 104, as shown in FIG. 9.

In some embodiments, the first pad 102*a*, the second pad 102*b*, the first repair pad 104*a*, and the second repair pad 104*b* belong to the same patterned conductive layer. For example, the first pad 102*a*, the second pad 102*b*, the first repair pad 104*a*, and the second repair pad 104*b* are formed by patterning the same conductive material layer. In some embodiments, the conductive material layer is formed by metal, metal oxide, metal nitride, or other suitable materials. In some embodiments, each of the first pad 102*a*, the second pad 102*b*, the first repair pad 104*a*, and the second repair pad 104*b* is a single-layer or multi-layer structure.

In each of the sub-pixels PX, the first bonding area 102 is located in a first direction D1 of the second bonding area 104. In this embodiment, in the first direction D1, the first pad 102*a* and the first repair pad 104*a* are arranged alternately, and the second pad 102*b* and the second repair pad 104*b* are arranged alternately. In a second direction D2, the first pad 102*a* and the second pad 102*b* are arranged alternately, and the first repair pad 104*a* and the second repair pad 104*b* are arranged alternately. In some embodiments, the first direction D1 is substantially perpendicular to the second direction D2.

Figure 2A:
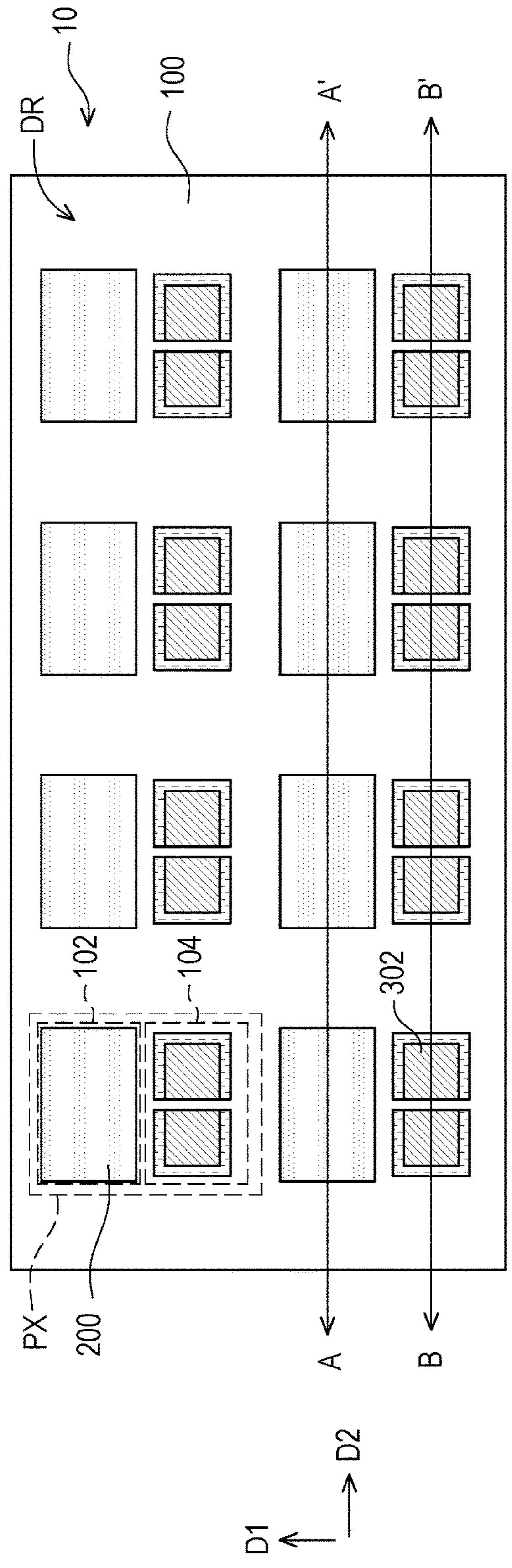
Figure 2B:
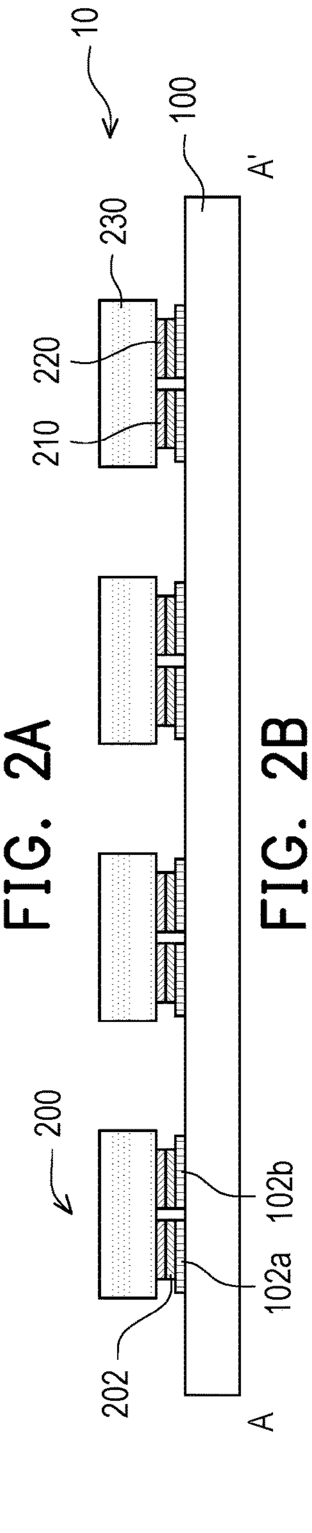
Figure 2C:
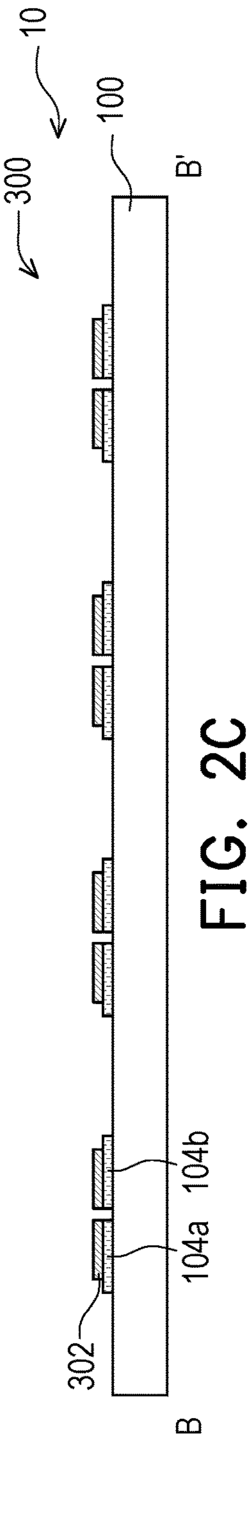

Referring to FIGS. 2A to 2C, multiple first solder structures 202 are respectively formed on the first pad 102*a* and the second pad 102*b* of the first bonding area 102. Optionally, multiple second solder structures 302 are respectively formed on the first repair pad 104*a* and the second repair pad 104*b* of the second bonding area 104. In this embodiment, the first solder structures 202 are formed on a portion of a top surface of each of the first pad 102*a* and the second pad 102*b* respectively, and exposes another portion of the top surface of each of the first pad 102*a* and the second pad 102*b*. The second solder structures 302 are formed on a portion of each of a top surface of the first repair pad 104*a* and the second repair pad 104*b* respectively, and exposes another portion of each of the top surface of the first repair pad 104*a* and the second repair pad 104*b*. In other embodiments, the first solder structures 202 completely cover the top surface of each of the first pad 102*a* and the second pad 102*b*, and the second solder structures 302 completely cover the top surface of each of the first repair pad 104*a* and the second repair pad 104*b*.

Next, multiple first light-emitting elements 200 are placed on the first bonding area 102 of each of the sub-pixels PX. In some embodiments, the first light-emitting elements 200 are transferred to the circuit substrate 100 through one or more mass transfer processes.

The first light-emitting element 200 is a micro light emitting diode or a mini light emitting diode. In some embodiments, the first light-emitting element 200 is a flip-chip LED, which includes a first electrode 210, a second electrode 220, and a semiconductor stack 230. In some embodiments, the semiconductor stack 230 includes a stack of N-type semiconductors and P-type semiconductors. The first electrode 210 and the second electrode 220 are electrically connected to the N-type semiconductors and the P-type semiconductors respectively. In some embodiments, the semiconductor stack 230 further includes a light-emitting layer between the N-type semiconductors and the P-type semiconductors. In some embodiments, the first light-emitting element 200 includes light emitting diodes of different colors. For example, the first light-emitting element 200 includes red light emitting diodes, green light emitting diodes, blue light emitting diodes, and/or or light emitting diodes of other colors. The light emitting diodes of different colors may include different semiconductor materials. In some embodiments, the first light-emitting elements 200 of different colors are arranged in the second direction D2, and the first light-emitting elements 200 of the same color are arranged in the first direction D1, but the disclosure is not limited thereto. In other embodiments, the first light-emitting elements 200 of different colors are arranged in the first direction D1, and the first light-emitting elements 200 of the same color are arranged in the second direction D2.

In this embodiment, the first electrode 210 of the first light-emitting element 200 is bonded to the first pad 102*a* of the corresponding first bonding area 102, and the second electrode 220 is bonded to the second pad 102*b* of the first bonding area 102. For example, the first solder structure 202 is solder with solder paste or other suitable materials, and the first electrode 210 and the second electrode 220 of the first light-emitting element 200 are respectively eutectic-bonded to the first pad 102*a* and the second pad 102*b* of the first bonding area 102 through the solder with solder paste. However, the disclosure is not limited thereto. The first solder structure 202 may also include other materials, such as tin, copper, silver, bismuth, indium, gallium, zinc, antimony, gold, nickel, tungsten, and other metals or metal alloys.

Figures 3A, 3B, 3C:
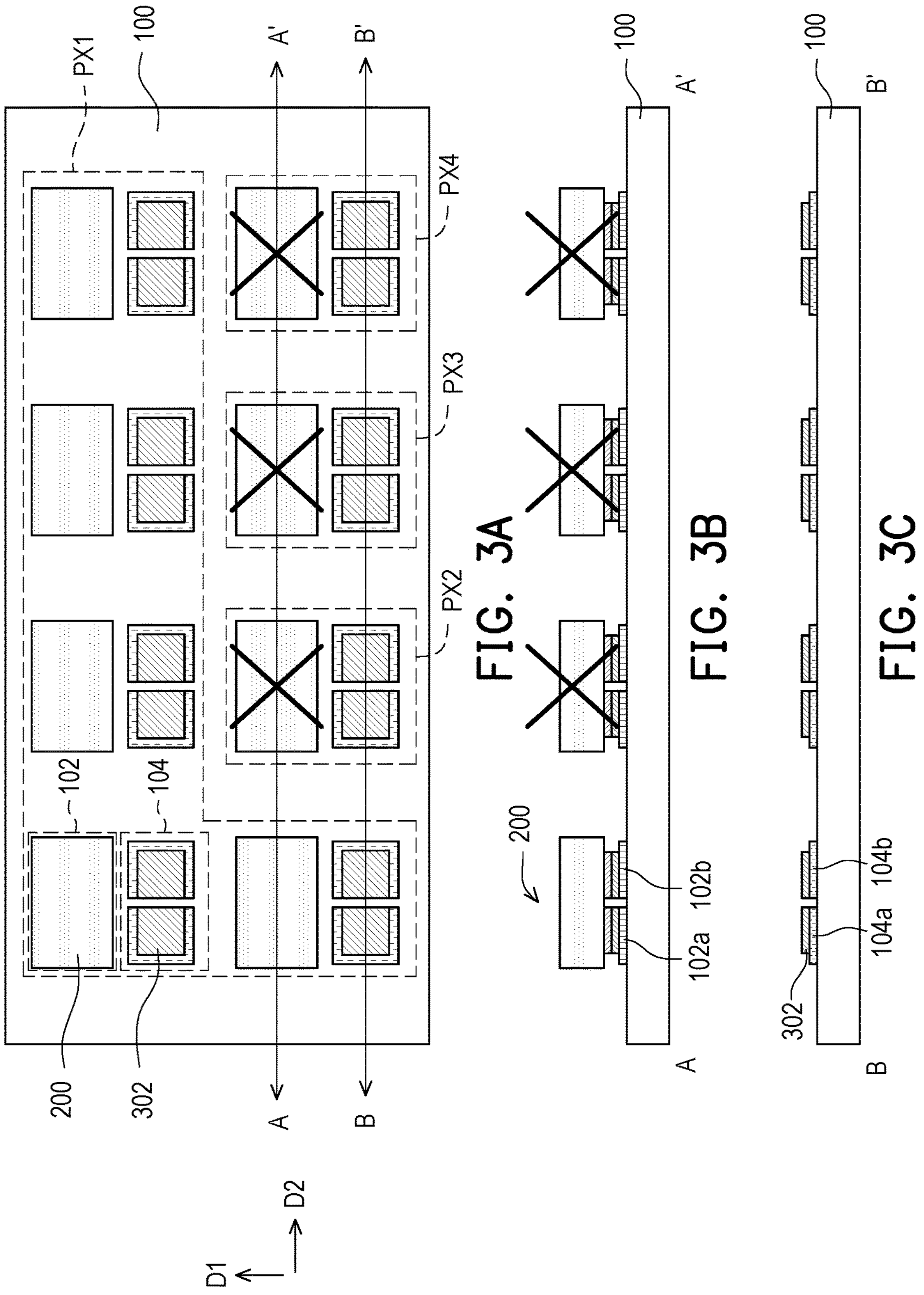

After the first light-emitting elements 200 are placed on the circuit substrate 100, the display device 10 is obtained. A detection procedure is performed on the display device 10 to check whether the first light-emitting elements 200 are correctly bonded to the circuit substrate 100. Referring to FIGS. 3A to 3C, after the first light-emitting elements 200 are bonded, multiple the sub-pixels in the display device 10 are detected.

After the detection procedure, it is found that the sub-pixels include a first sub-pixel PX1 where the first light-emitting elements 200 are bonded normally and a second sub-pixel PX2, a third sub-pixel PX3, and a fourth sub-pixel PX4 where the first light-emitting elements 200 do not emit light correctly. For example, in some embodiments, in the mass transfer process, the first light-emitting elements 200 are disposed on the first sub-pixel PX1, the second sub-pixel PX2, the third sub-pixel PX3, and the fourth sub-pixel PX4 respectively. The first light-emitting elements 200 are bonded to the first sub-pixel PX1 of the circuit substrate 100 through the first solder structure 202 (referring to FIG. 2B), and may operate normally. However, the first light-emitting elements 200 on the second sub-pixel PX2, the third sub-pixel PX3, and the fourth sub-pixel PX4 fails to operate correctly, which may be caused by defects in the first light-emitting element 200 on the second sub-pixel PX2, the third sub-pixel PX3, and the fourth sub-pixel PX4 (such as abnormal light-emitting brightness, abnormal light-emitting light pattern, or damaged light-emitting elements) or failure of a soldering process.

Figures 4A, 4B, 4C:
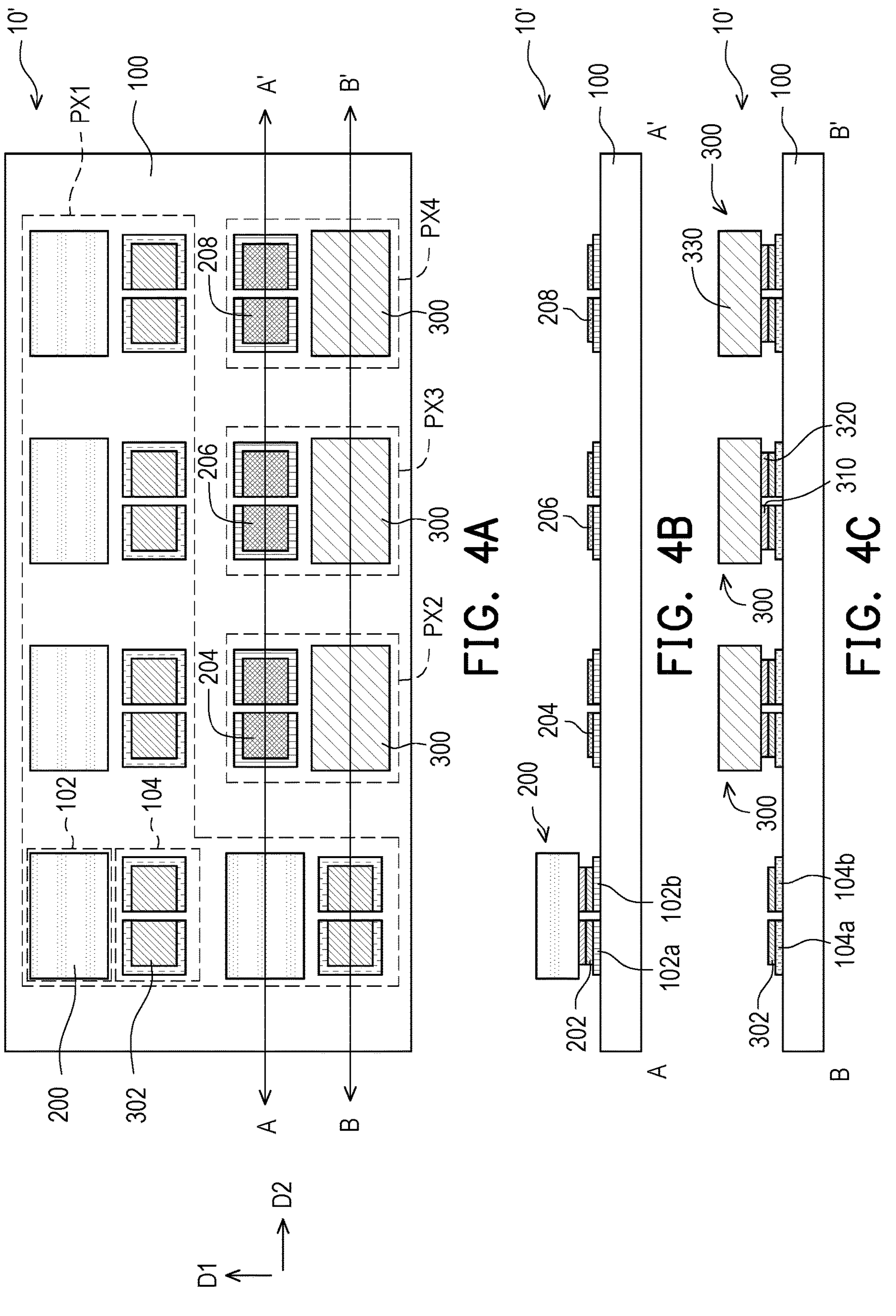

The repair process shown in FIGS. 4A to 4C will be performed on the faulty second sub-pixel PX2, third sub-pixel PX3, and fourth sub-pixel PX4.

Referring to FIGS. 4A to 4C, the first light-emitting elements 200 on the first bonding areas 102 of the second sub-pixel PX2, the third sub-pixel PX3, and the fourth sub-pixel PX4 are removed. For example, in this embodiment, the faulty first light-emitting elements 200 on the first bonding areas 102 of the second sub-pixel PX2, the third sub-pixel PX3, and the fourth sub-pixel PX4 are removed through laser trimming. At this time, there is first residual solder 204 on the first pad 102*a* and the second pad 102*b* of the first bonding area 102 of the second sub-pixel PX2. There is second residual solder 206 on the first pad 102*a* and the second pad 102*b* of the first bonding area 102 of the third sub-pixel PX3. There is fourth residual solder 208 on the first pad 102*a* and the second pad 102*b* of the first bonding area 102 of the fourth sub-pixel PX4. It should be noted that terms such as "first", "second", "third", and "fourth" herein are only used to distinguish different elements, which do not have other substantive meanings and do not limit the order in which the elements are formed. In some embodiments, the first residual solder 204, the second residual solder 206, and the fourth residual solder 208 may have uneven surfaces.

In some embodiments, the laser trimming includes ultraviolet laser, green laser, and infrared laser, and an operator may select an appropriate laser band according to composition of the solder. For example, if the first solder structure 202 contains indium, the ultraviolet laser may be optionally used to remove the faulty first light-emitting elements 200. However, the disclosure is not limited thereto.

Then, multiple second light-emitting elements 300 are respectively disposed on the second bonding areas 104 of the second sub-pixel PX2, the third sub-pixel PX3, and the fourth sub-pixel PX4. The second light-emitting elements 300 are bonded to the circuit substrate 100 through the second solder structure 302. A first electrode 310 and a second electrode 320 of the second light-emitting element 300 are eutectic-bonded to the circuit substrate 100 through the second solder structure 302 on the first repair pad 104*a* and the second repair pad 104*b* of the second bonding area 104 respectively. In some embodiments, the first solder structure 202 and the second solder structure 302 are, for example, formed in the same process, as shown in FIGS. 2A to 2C, but the disclosure is not limited thereto. In other embodiments, the first solder structure 202 and the second solder structure 302 are formed in different processes.

The second light-emitting element 300 is a micro light emitting diode or a mini light emitting diode. In some embodiments, the second light-emitting element 300 is a flip-chip LED, which includes the first electrode 310, the second electrode 320, and a semiconductor stack 330. In some embodiments, the semiconductor stack 330 includes a stack of N-type semiconductors and P-type semiconductors. The first electrode 310 and the second electrode 320 are electrically connected to the N-type semiconductors and the P-type semiconductors respectively. In some embodiments, the semiconductor stack 330 further includes a light-emitting layer between the N-type semiconductors and the P-type semiconductors. In some embodiments, the second light-emitting element 300 includes light emitting diodes of different colors. For example, the second light-emitting element 300 includes red light emitting diodes, green light emitting diodes, blue light emitting diodes, and/or or light emitting diodes of other colors. The light emitting diodes of different colors may include different semiconductor materials. In some embodiments, the colors of the second light-emitting element 300 on the second sub-pixel PX2, the third sub-pixel PX3, and the fourth sub-pixel PX4 are respectively the same as the colors of the first light-emitting element 200 originally intended to be disposed on the second sub-pixel PX2, the third sub-pixel PX3, and the fourth sub-pixel PX4. For example, when the red first light-emitting element 200 is damaged, the red second light-emitting element 300 is used for repair. When the green first light-emitting element 200 is damaged, the green second light-emitting element 300 is used for repair. When the blue first light-emitting element 200 is damaged, the blue second light-emitting element 300 is used for repair.

Figures 5A, 5B, 5C:
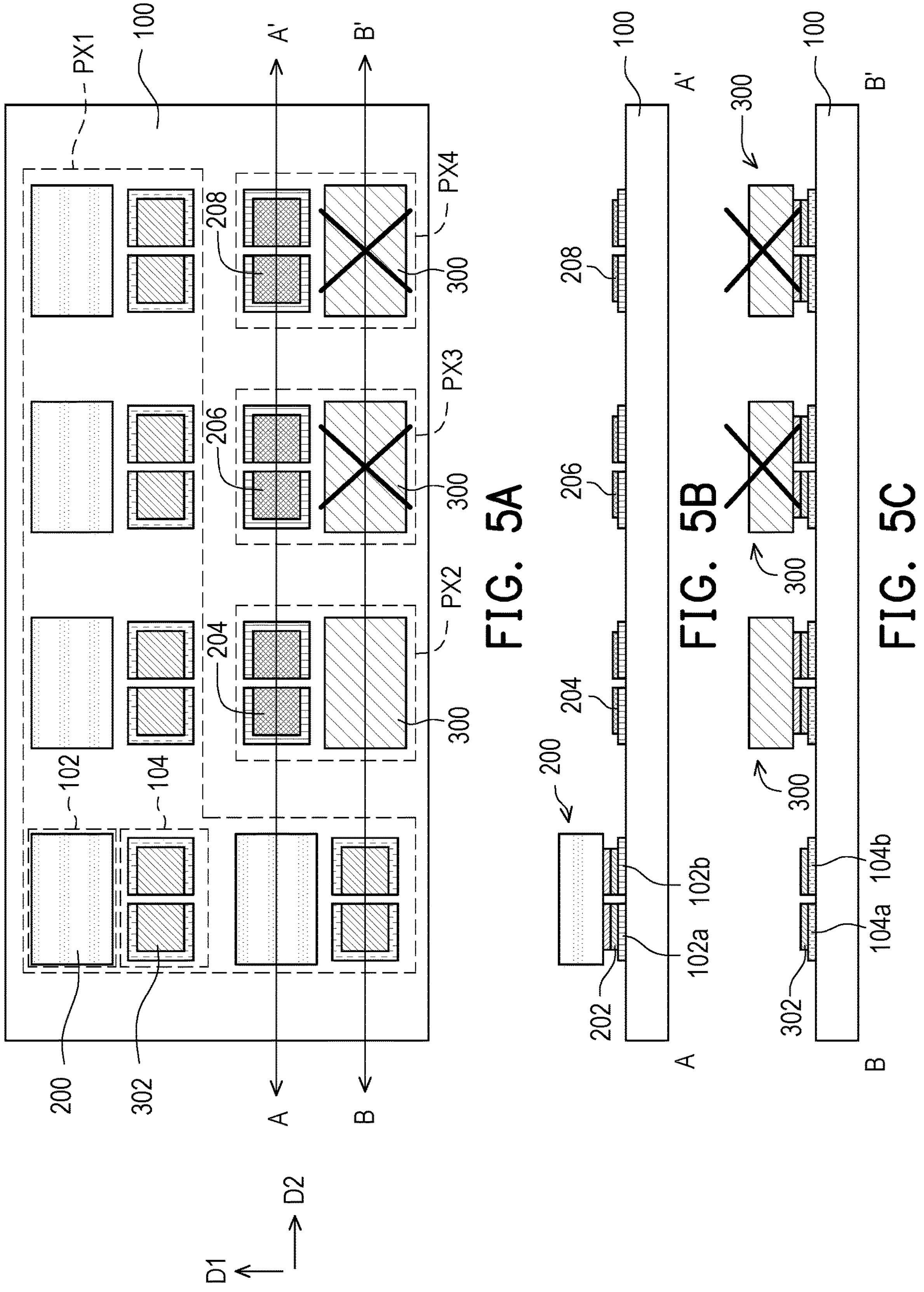

After the second light-emitting elements 300 are placed on the circuit substrate 100, the display device 10' that has been repaired once is obtained. The detection procedure is performed on the display device 10' that has been repaired once to check whether the second light-emitting elements 300 are correctly bonded to the circuit substrate 100. Referring to FIGS. 5A to 5C, after the second light-emitting elements 300 are bonded, the sub-pixels in the display device 10' that have been repaired once are detected.

After the detection procedure, it is found that the second light-emitting elements 300 on the second sub-pixel PX2 are normally bonded to the circuit substrate 100, but the second light-emitting elements 300 on the third sub-pixel PX3 and the fourth sub-pixel PX4 do not emit the light correctly. For example, in some embodiments, the second light-emitting elements 300 are bonded to the second sub-pixel PX2 of the circuit substrate 100 through the second solder structure 302 (referring to FIG. 4C), so that the second sub-pixel PX2 may operate normally. However, the second light-emitting elements 300 on the third sub-pixel PX3 and the fourth sub-pixel PX4 fail to operate correctly, which may be caused by defects in the second light-emitting elements 300 on the third sub-pixel PX3 and the fourth sub-pixel PX4 or the failure of the soldering process.

Figures 6A, 6B, 6C:
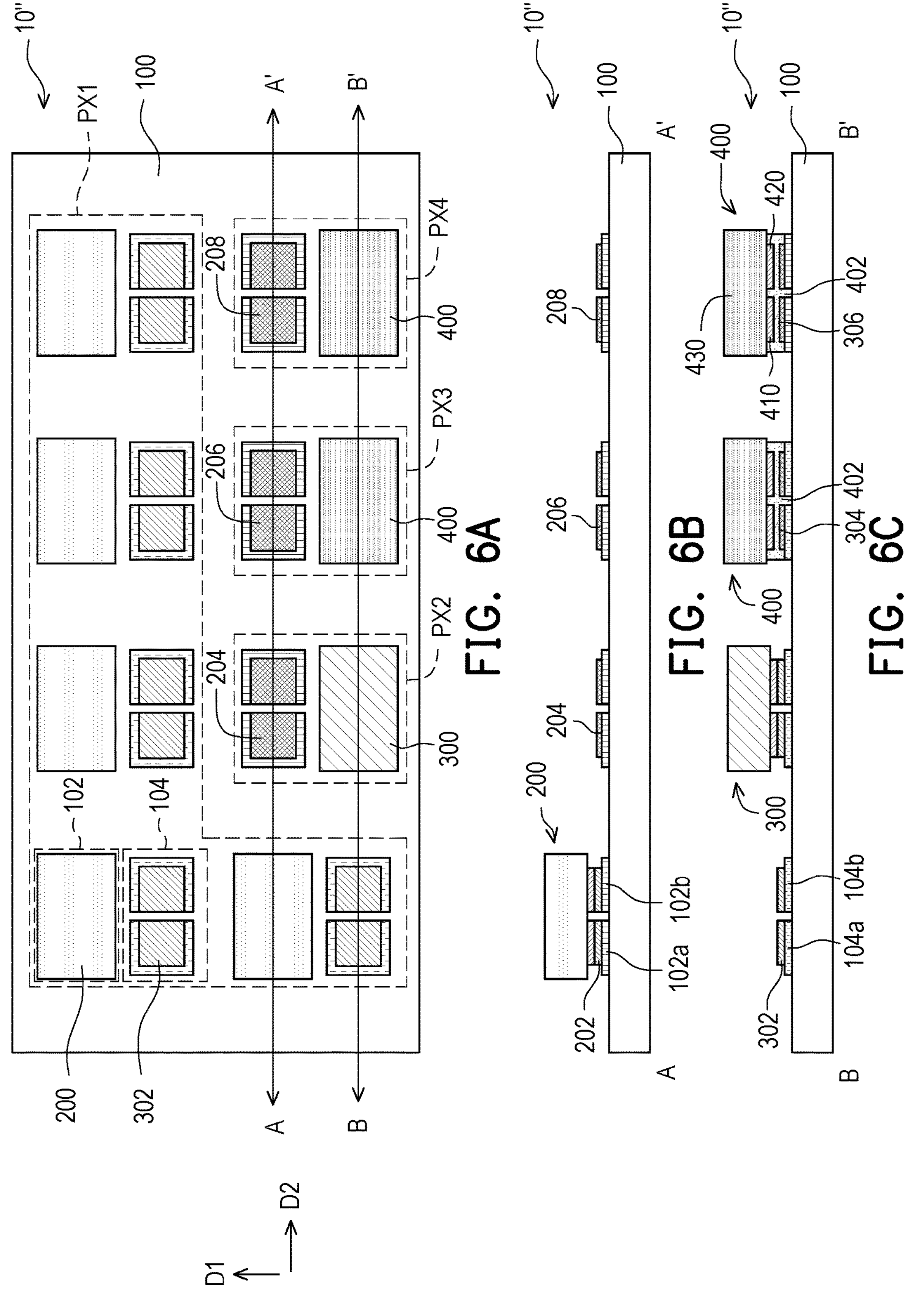

The repair process shown in FIGS. 6A to 6C will be performed on the faulty third sub-pixel PX3 and fourth sub-pixel PX4.

Referring to FIGS. 6A to 6C, the second light-emitting elements 300 on the second bonding areas 104 of the third sub-pixel PX3 and the fourth sub-pixel PX4 are removed. Specifically, in this embodiment, the faulty second light-emitting elements 300 on the second bonding areas 104 of the third sub-pixel PX3 and the fourth sub-pixel PX4 are removed through the laser trimming (for example, the ultra-violet laser). At this time, there is third residual solder 304 on the first repair pad 104*a* and the second repair pad 104*b* of the second bonding area 104 of the third sub-pixel PX3, and there is fifth residual solder 306 on the first repair pad 104*a* and the second repair pad 104*b* of the second bonding area 104 of the fourth sub-pixel PX4. In some embodiments, the third residual solder 304 and the fifth residual solder 306 may have uneven surfaces.

In this embodiment, the second residual solder 206 on the first bonding area 102 of the third sub-pixel PX3 is separated from the third residual solder 304 on the second bonding area 104, and the fourth residual solder 208 on the first bonding area 102 of the fourth sub-pixel PX4 is separated from the fifth residual solder 306 on the second bonding area 104.

A first conductive adhesive structure 402 is placed on the third sub-pixel PX3 and the fourth sub-pixel PX4. In this embodiment, the first conductive adhesive structure 402 is respectively disposed on the second bonding area 104 of the third sub-pixel PX3 and the second bonding area 104 of the fourth sub-pixel PX4, covering the first repair pad 104*a* and the second repair pad 104*b* and directly in contact with the third residual solder 304 and the fifth residual solder 306 located thereon. In other embodiments, the first conductive adhesive structure 402 is respectively disposed on the first bonding area 102 of the third sub-pixel PX3 and the first bonding area 102 of the fourth sub-pixel PX4, covering the first pad 102*a* and the second pad 102*b* and directly in contact with the second residual solder 206 and the fourth residual solder 208 located thereon.

Subsequently, multiple third light-emitting elements 400 are respectively disposed on the third sub-pixel PX3 and the fourth sub-pixel PX4. A first electrode 410 and a second electrode 420 of the third light-emitting elements 400 are electrically connected to the third sub-pixel PX3 and the fourth sub-pixel PX4 of the circuit substrate 100 through the first conductive adhesive structure 402. In this embodiment, the third light-emitting elements 400 are electrically connected to the first repair pad 104*a* and the second repair pad 104*b*. In other embodiments, the third light-emitting elements 400 are electrically connected to the first pad 102*a* and the second pad 102*b*. In some embodiments, the third light-emitting elements 400 are bonded to the first conductive adhesive structure 402 by applying pressure and heating.

The third light-emitting element 400 is a micro light emitting diode or a mini light emitting diode. In some embodiments, the third light-emitting element 400 is a flip-chip LED, which includes the first electrode 410, the second electrode 420, and a semiconductor stack 430. In some embodiments, the semiconductor stack 430 includes a stack of N-type semiconductors and P-type semiconductors. The first electrode 410 and the second electrode 420 are electrically connected to the N-type semiconductors and the P-type semiconductors respectively. In some embodiments, the semiconductor stack 430 further includes a light-emitting layer between the N-type semiconductors and the P-type semiconductors. In some embodiments, the third light-emitting element 400 includes light emitting diodes of different colors. For example, the third light-emitting element 400 includes red light emitting diodes, green light emitting diodes, blue light emitting diodes, and/or or light emitting diodes of other colors. The light emitting diodes of different colors may include different semiconductor materials. In some embodiments, the colors of the third light-emitting element 400 on the third sub-pixel PX3 and the fourth sub-pixel PX4 are respectively the same as the colors of the second light-emitting element 300 (or the first light-emitting element 200) originally intended to be disposed on the third sub-pixel PX3 and the fourth sub-pixel PX4. For example, when the red second light-emitting element 300 is damaged, the red third light-emitting element 400 is used for repair. When the green second light-emitting element 300 is damaged, the green third light-emitting element 400 is used for repair. When the blue second light-emitting element 300 is damaged, the blue third light-emitting element 400 is used for repair.

In some embodiments, the first conductive adhesive structure 402 includes anisotropic conductive film, silver adhesive, conductive carbon adhesive, or other suitable adhesive materials, which the operator may select according to the requirements. For example, in this embodiment, a sheet-shaped anisotropic conductive film (ACF) is placed on the first repair pad 104*a* and the second repair pad 104*b* through laser transposition. Through conductive particles contained in the ACF, the third light-emitting elements 300 are electrically connected to the first repair pad 104*a* and the second repair pad 104*b* (or the first pad 102*a* and the second pad 102*b*) of the third sub-pixel PX3 and the fourth sub-pixel PX4. Generally speaking, the residual solder on the pad includes intermetallic compounds, which will hinder the soldering process on the pad. In this embodiment, the first conductive adhesive structure 402 is used to perform a second repair process, instead of using the soldering process to perform the second repair process. Therefore, even if there is residual solder on the pad, the third light-emitting elements 400 may still be electrically connected to the circuit substrate 100 through the first conductive adhesive structure 402. When the first conductive adhesive structure 402 includes materials such as silver adhesive and conductive carbon adhesive, the first conductive adhesive structure 402 includes two block structures that are separated from each other, and the two block structures are respectively placed on the first repair pad 104*a* and the second repair pad 104*b*, thereby avoiding short circuit of the first repair pad 104*a* and the second repair pad 104*b*.

In this embodiment, the third light-emitting elements 400 is disposed on the second bonding areas 104 of the third sub-pixel PX3 and the fourth sub-pixel PX4, which helps to prevent a configuration process of the third light-emitting elements 400 from being affected by a relatively high number of normal light-emitting elements. That is, the third light-emitting element 400 has a greater repair and transposition space. In other embodiments, the third light-emitting elements 400 may be optionally disposed on the first bonding areas 102 of the third sub-pixel PX3 and the fourth sub-pixel PX4.

Figures 7A, 7B, 7C:
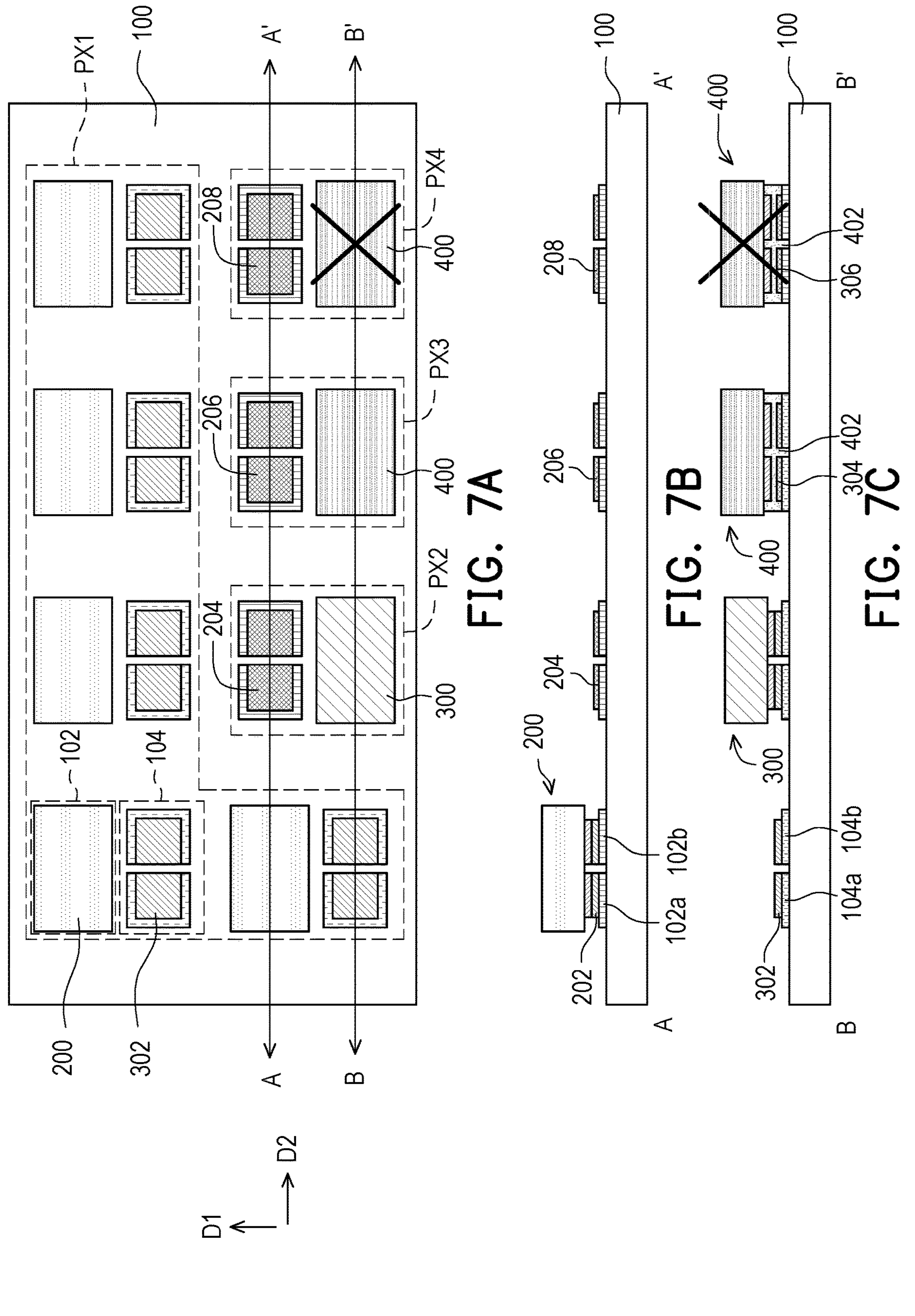

After the third light-emitting elements 400 are placed on the circuit substrate 100, a display device 10" that has been repaired twice is obtained. The detection procedure is performed on the display device 10" that has been repaired twice to check whether the third light-emitting elements 400 are correctly bonded to the circuit substrate 100. Referring to FIGS. 7A to 7C, after the third light-emitting elements 400 are bonded, the sub-pixels in the display device 10" that has been repaired twice are detected.

After the detection procedure, it is found that the third light-emitting elements 400 on the third sub-pixel PX3 are normally bonded to the circuit substrate 100, but the third light-emitting elements 400 on the fourth sub-pixel PX4 do not emit the light correctly. For example, in some embodiments, the third light-emitting elements 400 are bonded to the third sub-pixel PX3 of the circuit substrate 100 through the first conductive adhesive structure 402, so that the third sub-pixel PX3 may operate normally. However, the third light-emitting elements 400 on the fourth sub-pixel PX4 fail to operate correctly, which may be caused by defects in the third light-emitting elements 400 on the fourth sub-pixel PX4 or the failure of the soldering process.

Figures 8A, 8B, 8C:
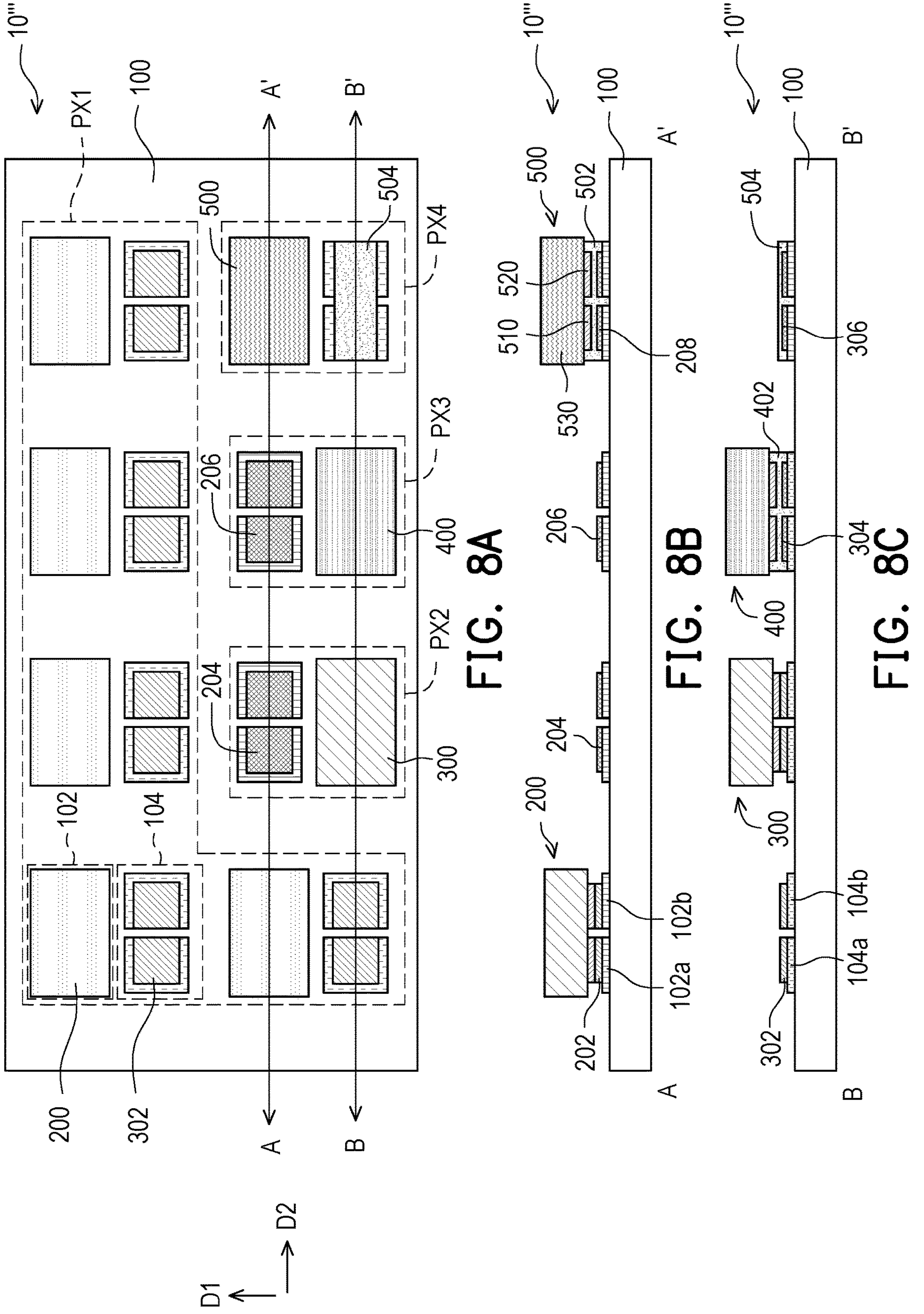

The repair process shown in FIGS. 8A to 8C will be performed on the faulty fourth sub-pixel PX4.

Referring to FIGS. 8A to 8C, the third light-emitting elements 400 on the fourth sub-pixel PX4 are removed. Specifically, in this embodiment, the faulty third light-emitting elements 400 on the second bonding area 104 of the fourth sub-pixel PX4 are removed through the laser trimming. At this time, there are the fifth residual solder 306 and residual conductive adhesive 504 on the first repair pad 104*a* and the second repair pad 104*b* of the second bonding area 104 of the fourth sub-pixel PX4. Next, a second conductive adhesive structure 502 is placed on the first pad 102*a* and the second pad 102*b* of the fourth sub-pixel PX4. At this time, the second conductive adhesive structure 502 will be in direct contact with the fourth residual solder 208.

In this embodiment, the third light-emitting elements 400 on the fourth sub-pixel PX4 are bonded to the first repair pad 104*a* and the second repair pad 104*b* through the first conductive adhesive structure 402 (for example, the sheet-shaped ACF). Therefore, a green laser of 532 nm is used to remove the third light-emitting elements 400. However, the disclosure is not limited thereto.

In this embodiment, the residual conductive adhesive 504 is located on the second bonding area 104 of the fourth sub-pixel PX4, and the second conductive adhesive structure 502 is located on the first bonding area 102 of the fourth sub-pixel PX4. However, the disclosure is not limited thereto. In other embodiments, the residual conductive adhesive 504 is located on the first bonding area 102 of the fourth sub-pixel PX4, and the second conductive adhesive structure 502 is located on the second bonding area 104 of the fourth sub-pixel PX4.

Then, fourth light-emitting elements 500 are disposed on the fourth sub-pixel PX4, and are bonded to the circuit substrate 100 through the second conductive adhesive structure 502. A first electrode 510 and a second electrode 520 of the fourth light-emitting element 500 are electrically connected to the fourth sub-pixel PX4 of the circuit substrate 100 through the second conductive adhesive structure 502, for example, are electrically connected to the first pad 102*a* and the second pad 102*b*. In some embodiments, the fourth light-emitting elements 500 are bonded to the second conductive adhesive structure 502 by applying pressure and heating. After the fourth light-emitting elements 500 are placed on the circuit substrate 100, the display device 10'" that has been repaired three times is obtained.

The fourth light-emitting element 500 is a micro light emitting diode or a mini light emitting diode. In some embodiments, the fourth light-emitting element 500 is a flip-chip LED, which includes the first electrode 510, the second electrode 520, and a semiconductor stack 530. In some embodiments, the semiconductor stack 530 includes a stack of N-type semiconductors and P-type semiconductors. The first electrode 510 and the second electrode 520 are electrically connected to the N-type semiconductors and the P-type semiconductors respectively. In some embodiments, the semiconductor stack 530 further includes a light-emitting layer between the N-type semiconductors and the P-type semiconductors. In some embodiments, the fourth light-emitting element 500 includes light emitting diodes of different colors. For example, the fourth light-emitting element 500 includes red light emitting diodes, green light emitting diodes, blue light emitting diodes, and/or or light emitting diodes of other colors. The light emitting diodes of different colors may include different semiconductor materials. In some embodiments, the colors of the fourth light-emitting element 500 on the fourth sub-pixel PX4 are respectively the same as the colors of the third light-emitting element 400 (or the first light-emitting element 200) originally intended to be disposed on the fourth sub-pixel PX4. For example, when the red third light-emitting element 400 is damaged, the red fourth light-emitting element 500 is used for repair. When the green third light-emitting element 400 is damaged, the green fourth light-emitting element 500 is used for repair. When the blue third light-emitting element 400 is damaged, the blue fourth light-emitting element 500 is used for repair.

In some embodiments, the second conductive adhesive structure 502 includes anisotropic conductive film, silver adhesive, conductive carbon adhesive, or other suitable adhesive materials, which the operator may select according to the requirements.

Based on the above, even if the pad (or the repair pad) includes the residual solder with the intermetallic compounds, the first conductive adhesive structure 402 may still be used to perform second repair, or even the second conductive adhesive structure 502 may be used to perform a third repair. Therefore, more repair processes may be used to reduce defective pixels in the display device 10'".

FIGS. 10A to 11C are various views of a manufacturing method of a display device 20' according to an embodiment of the disclosure. It is noted that some of the reference numerals and descriptions of the embodiments of FIGS. 1A to 8C will apply to the embodiments of FIGS. 10A to 11C. The same reference numerals will represent the same or similar components and the descriptions of the same technical contents will be omitted. Reference may be made to the above embodiment for the omitted descriptions, which will not be repeated in the following embodiments.

Figures 10A, 10B, 10C:
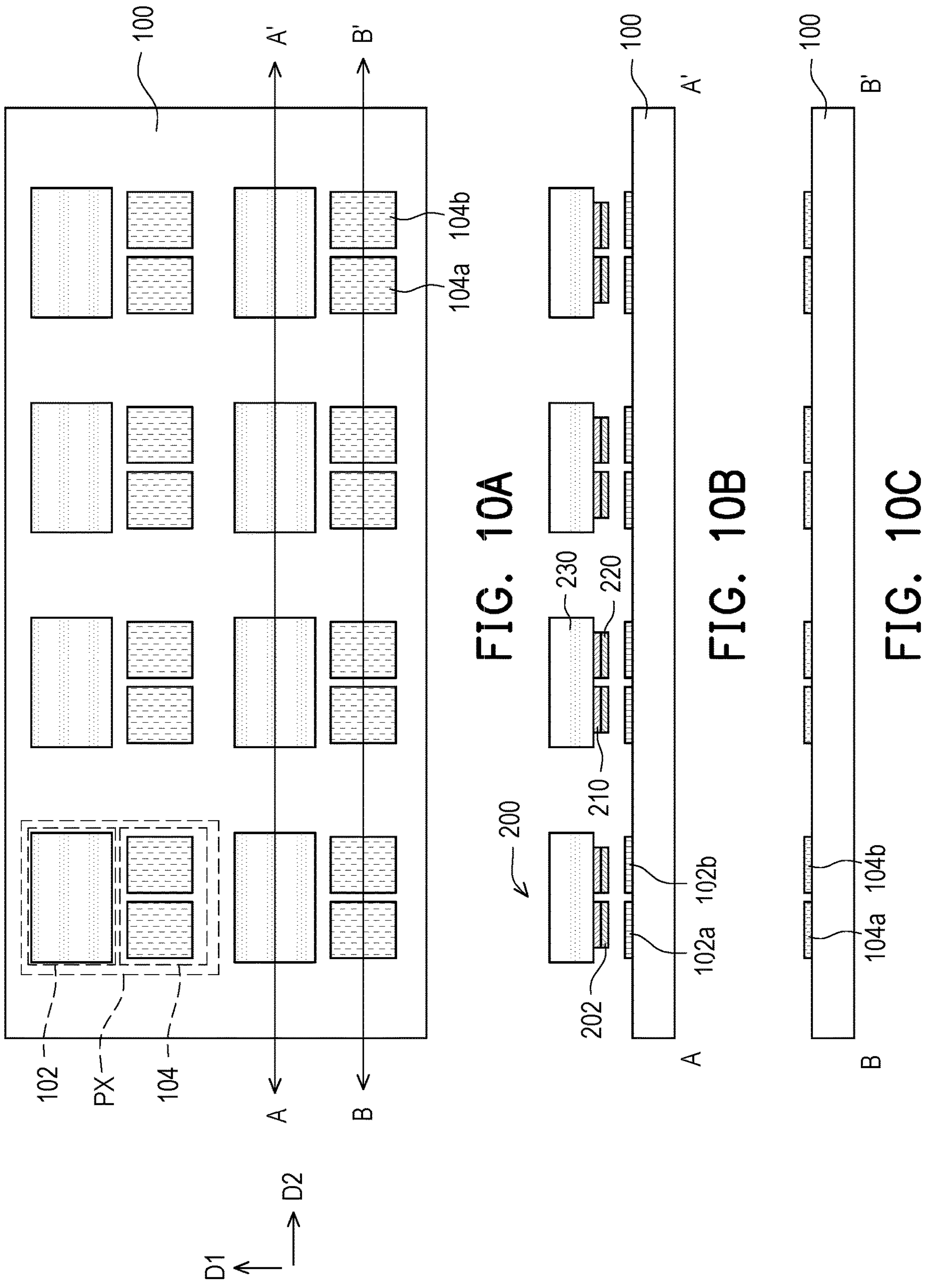
FIGS. 10A and 11A are schematic top views of a manufacturing method of a display device according to an embodiment of the disclosure.
FIGS. 10B and 11B are schematic cross-sectional views taken along a line A-A' in FIGS. 10A and 11A respectively.
FIGS. 10C and 11C are schematic cross-sectional views taken along a line B-B' in FIGS. 10A and 11A respectively.

Referring to FIGS. 10A to 10C, in this embodiment, the first solder structure 202 is formed on the first electrode 210 and the second electrode 220 of the first light-emitting element 200. Therefore, there is no need to pre-form a solder structure on the first pad 102*a*, the second pad 102*b*, the first repair pad 104*a*, and the second repair pad 104*b*.

Figure 11A:
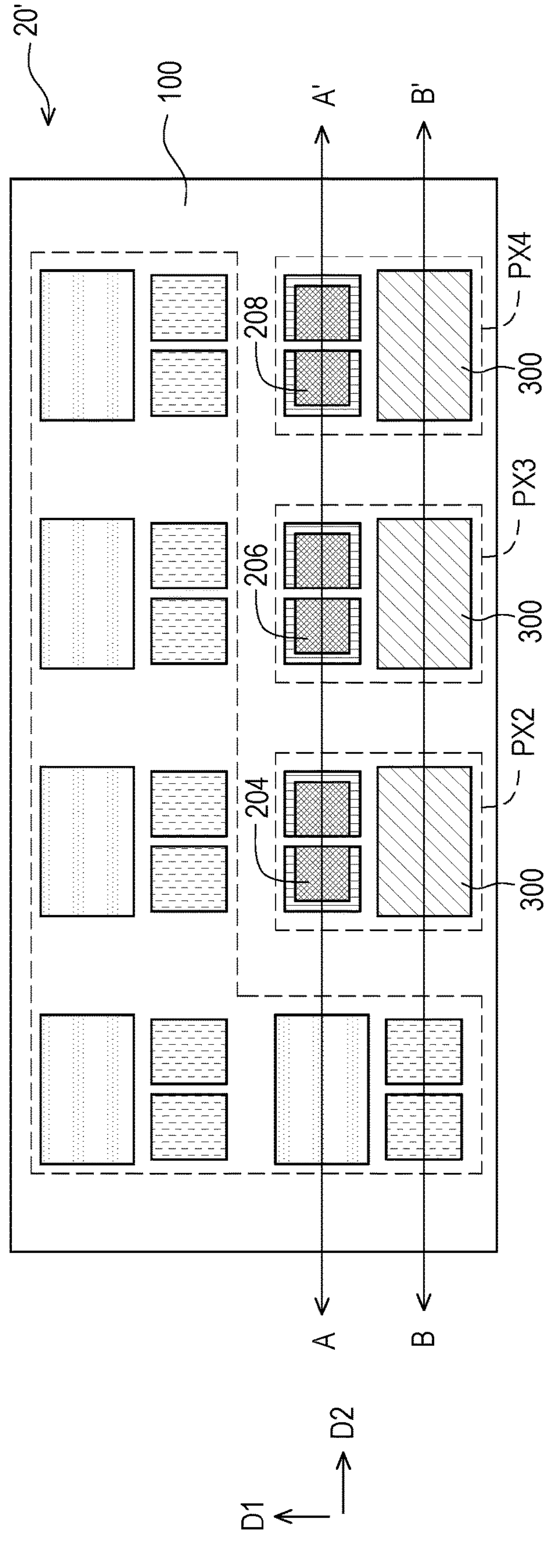
Figure 11B:
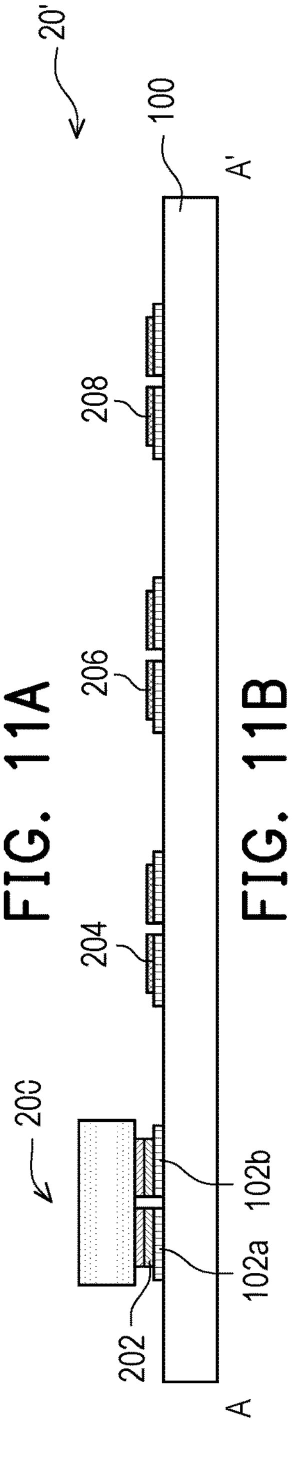
Figure 11C:
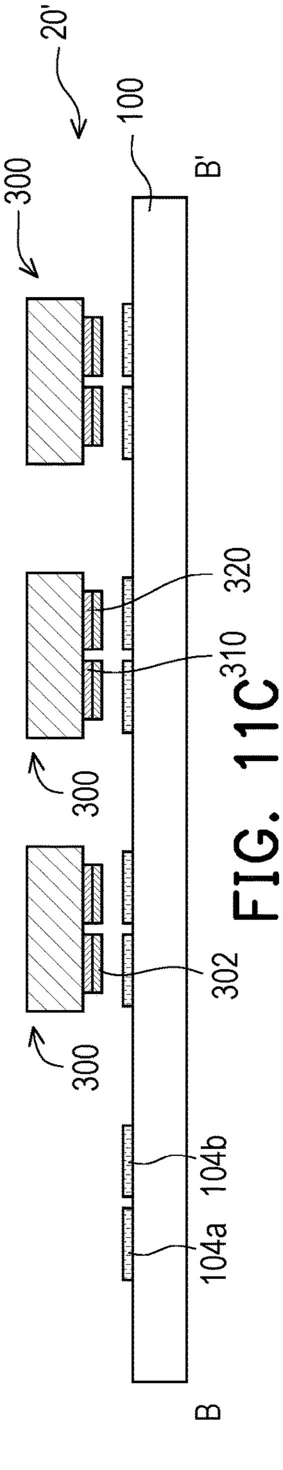

Referring to FIGS. 11A to 11C, after the faulty first light-emitting elements 200 are removed, the second light-emitting elements 300 is used to perform the repair process. In this embodiment, the second solder structure 302 is formed on the first electrode 310 and the second electrode 320 of the second light-emitting element 300. Therefore, there is no need to pre-form the second solder structure 302 on the first repair pad 104*a* and the second repair pad 104*b*. In this way, there is no need to dispose the second solder structure 302 on the second bonding area 104 where the first light-emitting elements 200 are not bonded, which helps to save material costs.

After the display device 20' that has been repaired once is obtained, the second repair process and the third repair process may be performed using the processes in FIGS. 5A to 8C.

FIGS. 12A to 22C are various views of a manufacturing method of a display device according to an embodiment of the disclosure. Specifically, FIGS. 12A to 16C are schematic views of a manufacturing method of a display device 30. When it is found that some pixels in the display device 30 are faulty, the repair process shown in FIGS. 17A to 22C may be adopted to obtain a repaired display device 30'''.

Figure 12A:
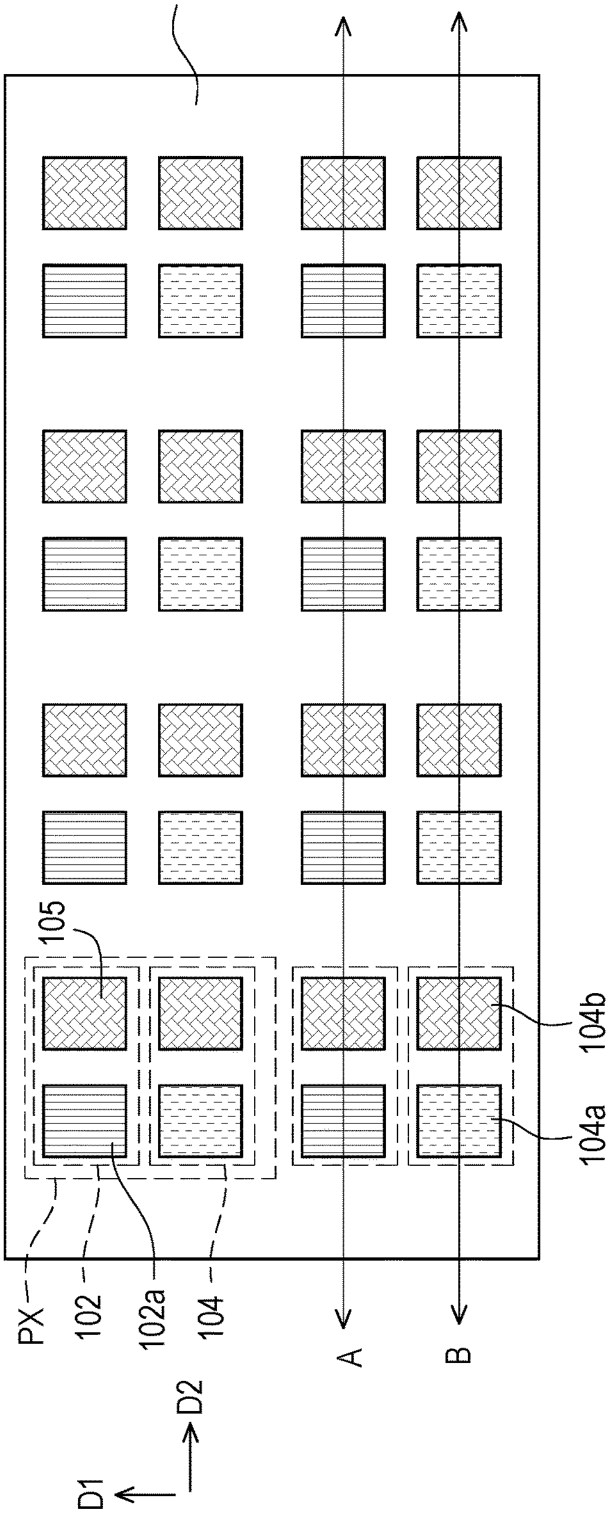
FIGS. 12A, 13A, 14A, 15A, 16A, 17A, 18A, 19A, 20A, 21A, and 22A are schematic top views of a manufacturing method of a display device according to an embodiment of the disclosure.
Figure 12B:
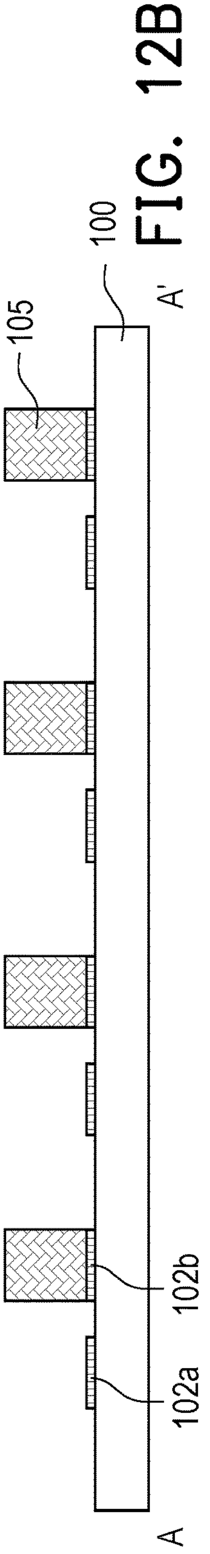
FIGS. 12B, 13B, 14B, 15B, 16B, 17B, 18B, 19B, 20B, 21B, and 22B are schematic cross-sectional views taken along the line A-A' in FIGS. 12A, 13A, 14A, 15A, 16A, 17A, 18A, 19A, 20A, 21A, and 22A respectively.
Figure 12C:
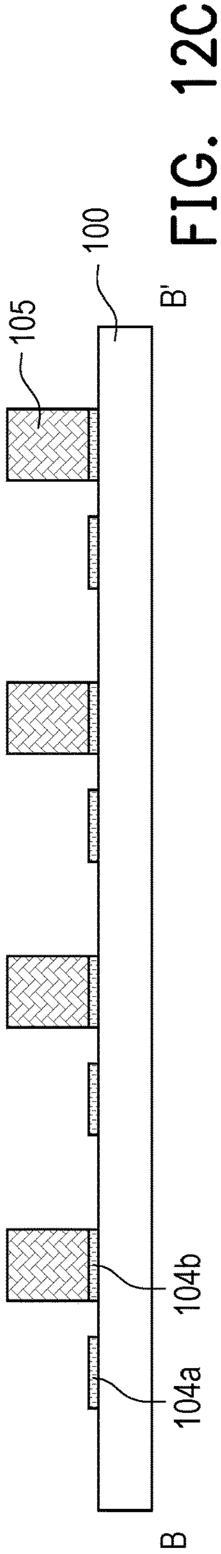
FIGS. 12C, 13C, 14C, 15C, 16C, 17C, 18C, 19C, 20C, 21C, and 22C are schematic cross-sectional views taken along the line B-B' in FIGS. 12A, 13A, 14A, 15A, 16A, 17A, 18A, 19A, 20A, 21A, and 22A respectively.

Referring to FIGS. 12A, 12B, and 12C, the circuit substrate 100 is provided. For the description of the circuit substrate 100, reference may be made to FIGS. 1A to 1C and related contents, which will not be repeated in the following.

Multiple conductive blocks 105 are disposed on the sub-pixel PX. In this embodiment, each of the sub-pixels PX has two conductive blocks 105, which are respectively disposed on the second pad 102*b* and the second repair pad 104*b*. In some embodiments, the conductive block 105 further includes a seed layer (not shown). For example, a method of forming the conductive block 105 includes the following steps. First, the seed layer and a patterned photoresist layer are formed on the circuit substrate 100. The seed layer is in contact with the second pad 102*b* and the second repair pad 104*b*, and the patterned photoresist layer has multiple openings that expose the second pad 102*b* and the second repair pad 104*b*. Next, a metal material is formed on the seed layer in the openings of the patterned photoresist layer through electroplating. Finally, the patterned photoresist layer and the redundant seed layer are removed, and the remaining metal material and seed layer form the conductive block 105. In some embodiments, the seed layer includes titanium, copper, other suitable conductive materials, or a combination of the foregoing materials, and the metal material formed by electroplating includes gold, copper, other suitable metal materials, or a combination of the foregoing materials.

Figure 13A:
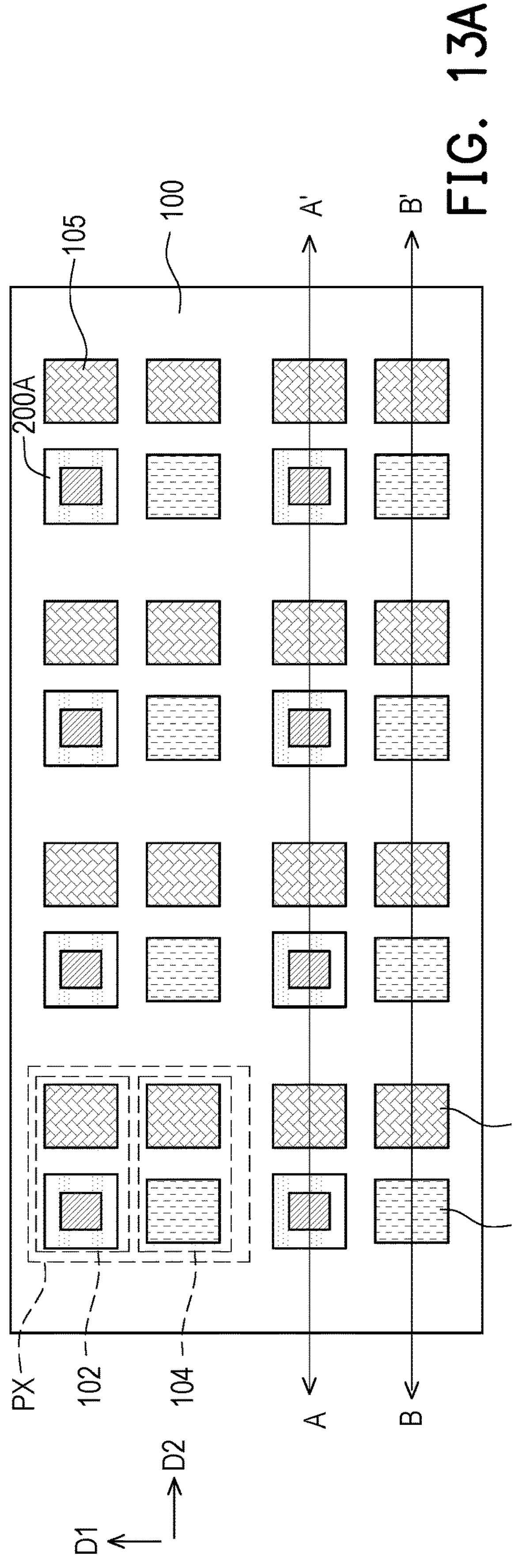
Figure 13B:
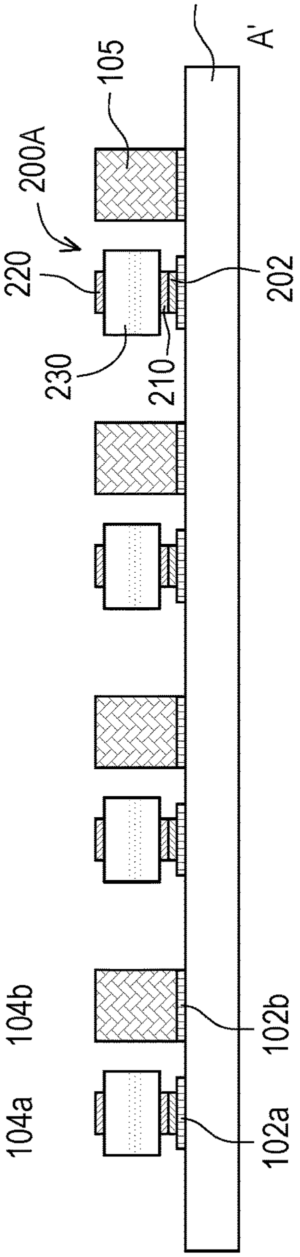
Figure 13C:
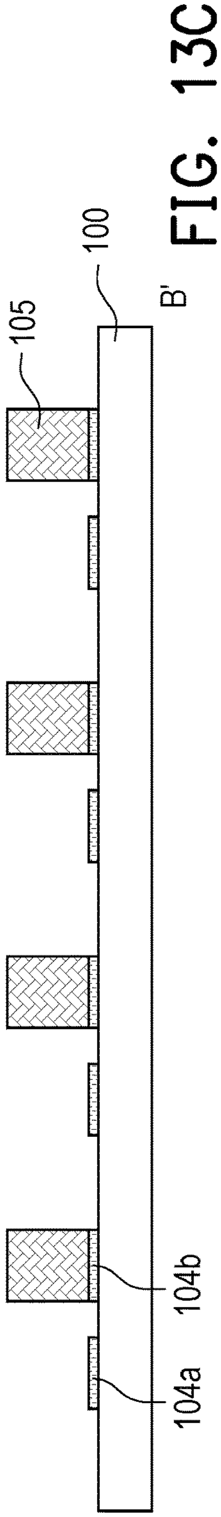

Referring to FIGS. 13A to 13C, multiple first light-emitting elements 200A are placed on the first pad 102*a* of the first bonding area 102 of each of the sub-pixels PX. In some embodiments, the first light-emitting elements 200A are transferred to the circuit substrate 100 through one or more mass transfer processes.

The first light-emitting element 200A is a micro light emitting diode or a mini light emitting diode. In some embodiments, the first light-emitting element 200A is a vertical light emitting diode, which includes the first electrode 210, the second electrode 220, and the semiconductor stack 230. In some embodiments, the semiconductor stack 230 includes the stack of N-type semiconductors and P-type semiconductors. The first electrode 210 and the second electrode 220 are electrically connected to the N-type semiconductors and the P-type semiconductors respectively. In some embodiments, the semiconductor stack 230 further includes the light-emitting layer between the N-type semiconductors and the P-type semiconductors. In some embodiments, the first light-emitting element 200A includes light emitting diodes of different colors. For example, the first light-emitting element 200A includes red light emitting diodes, green light emitting diodes, blue light emitting diodes, and/or or light emitting diodes of other colors. The light emitting diodes of different colors may include different semiconductor materials. In some embodiments, the first light-emitting elements 200A of different colors are arranged in the second direction D2, and the first light-emitting elements 200A of the same color are arranged in the first direction D1. However, the disclosure is not limited thereto. In other embodiments, the first light-emitting elements 200A of different colors are arranged in the first direction D1, and the first light-emitting elements 200A of the same color are arranged in the second direction D2.

In this embodiment, the first electrode 210 of the first light-emitting element 200A is bonded to the first pad 102*a* of the corresponding first bonding area 102. For example, the first electrode 210 has the first solder structure 202, and the first electrode 210 of the first light-emitting element 200A is eutectic-bonded to the first pad 102*a* of the first bonding area 102 through the first solder structure 202. In other embodiments, the first solder structure 202 is pre-formed on the circuit substrate 100. Then the first light-emitting elements 200A are transposed to the circuit substrate 100.

Figures 14A, 14B, 14C:
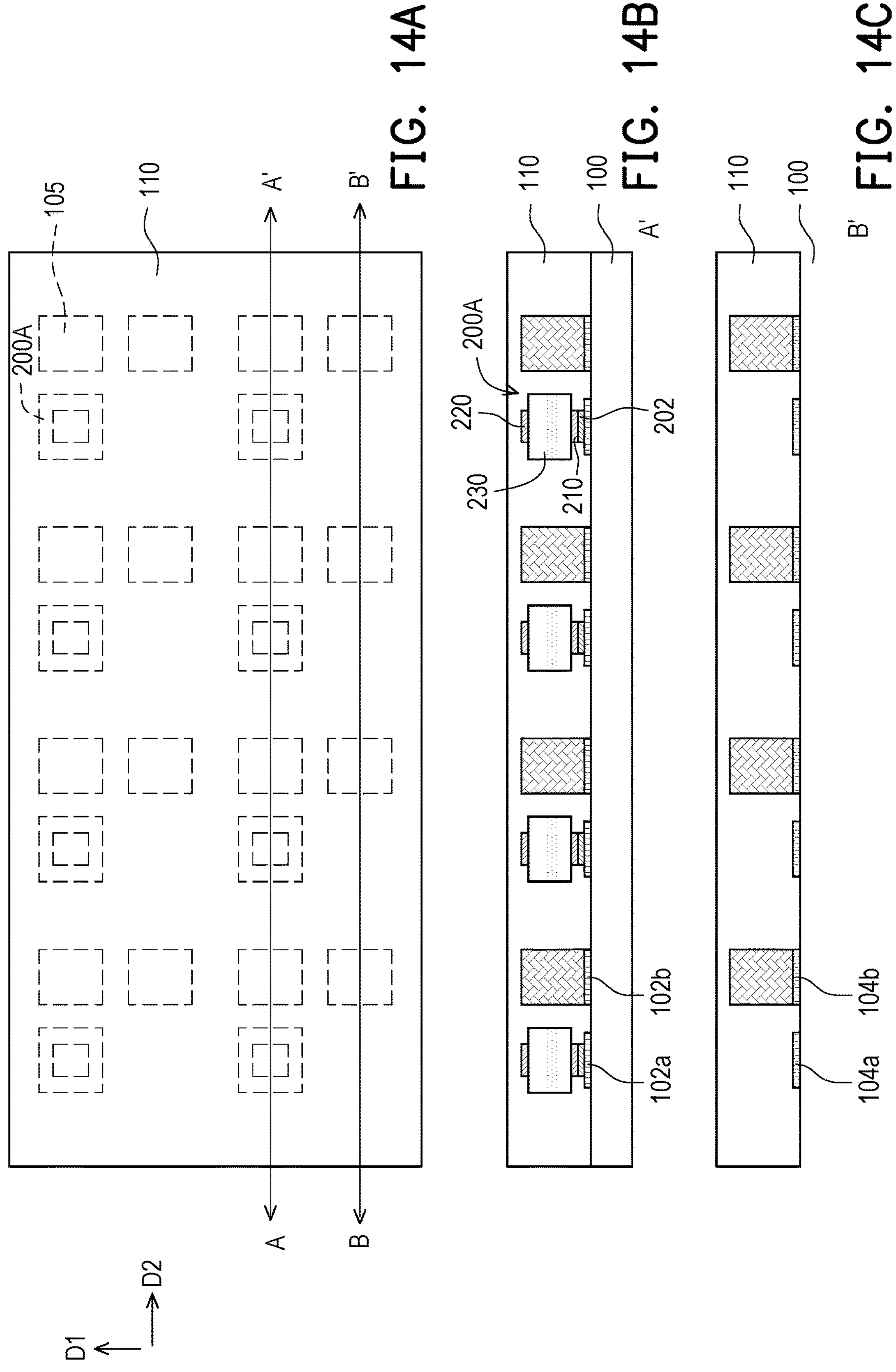
Figures 15A, 15B, 15C:
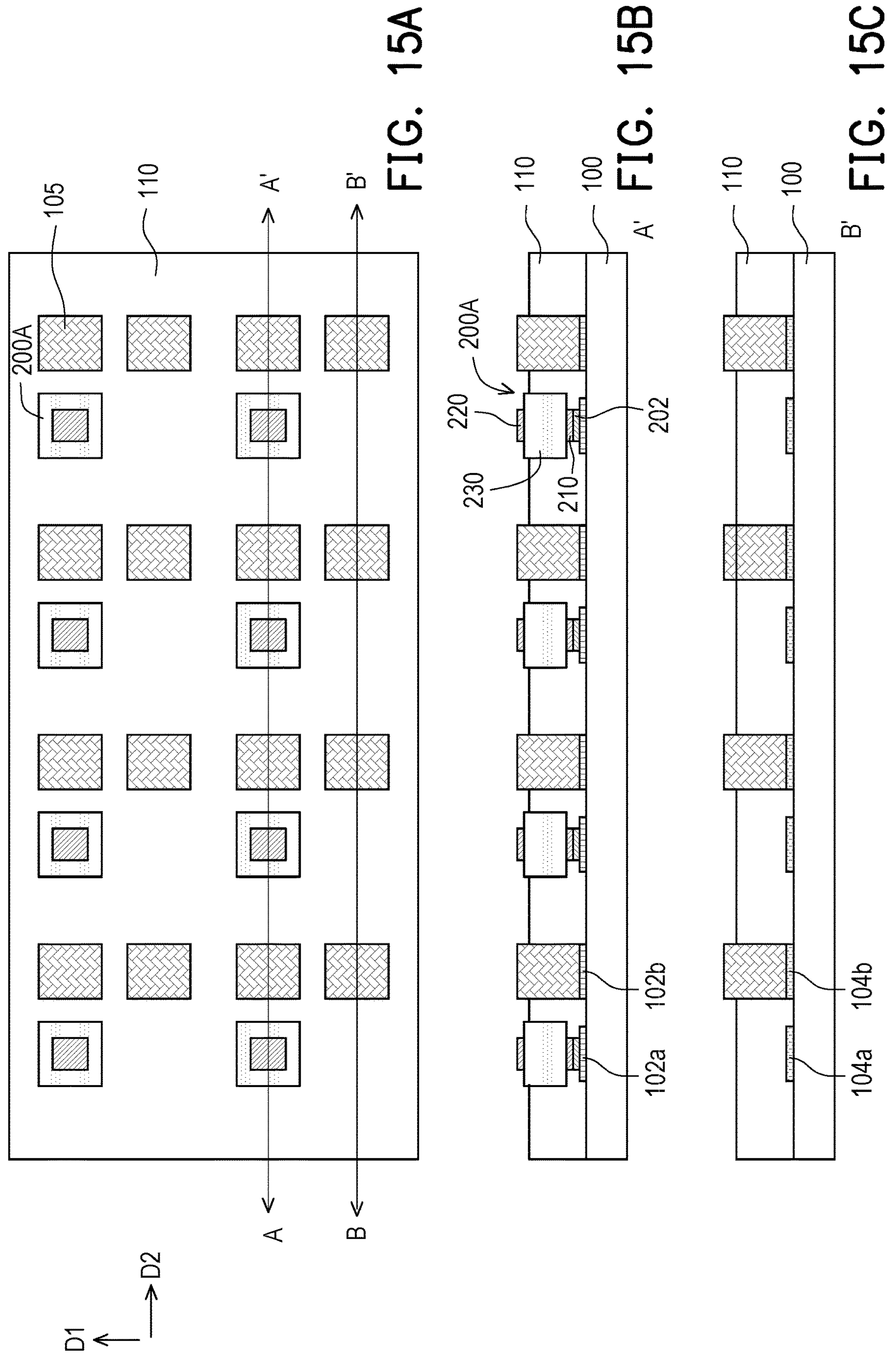

Referring to FIGS. 14A to 14C, a flat layer 110 is formed to laterally surround the first light-emitting element 200A and the conductive block 105. In some embodiments, the flat layer 110 includes a transparent material, a gray material, or a black material. For example, the flat layer 110 includes package adhesive/lamination adhesive (such as epoxy resin, silicone), organic materials suitable for a yellow light manufacturing processes (such as acrylic adhesive), or other suitable materials, and the flat layer 110 optionally includes carbon black, scattering particles, or other filler particles. In this embodiment, the flat layer 110 covers a top surface of the conductive block 105 and a top surface of the first light-emitting element 200A. Therefore, plasma processing is required to be performed to remove a portion of the flat layer 110, so that the conductive block 105 and the first light-emitting element 200A may be exposed, as shown in FIGS. 15A to 15C. In some embodiments, the plasma processing is performed, for example, through sulfur hexafluoride plasma, carbon tetrafluoride plasma, oxygen plasma, or combinations thereof.

Figures 16A, 16B, 16C:
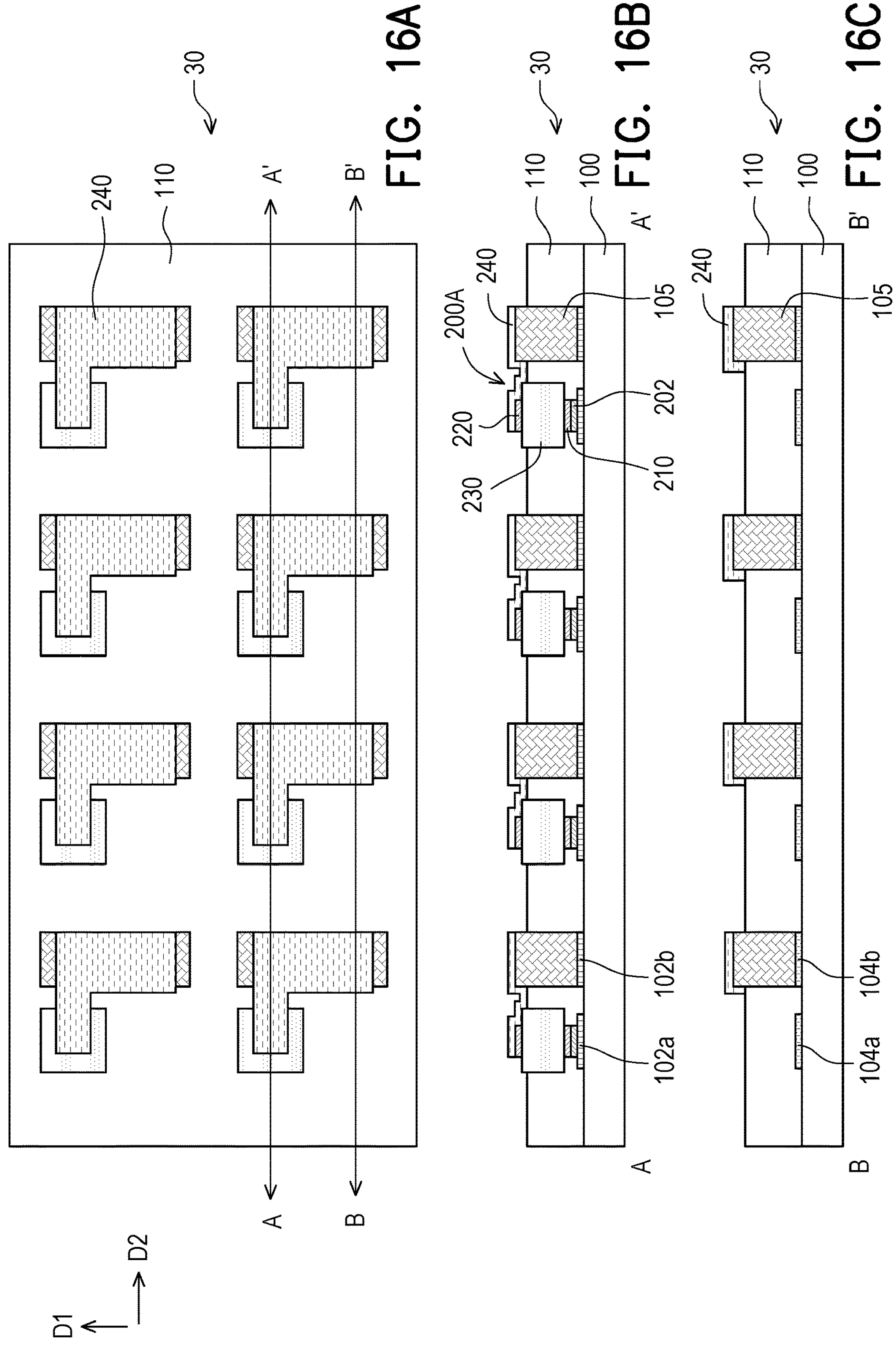

Referring to FIGS. 16A to 16C, a first interconnect structure 240 is formed on the flat layer 110. The first interconnect structure 240 is electrically connected to the second electrode 220 of the first light-emitting element 200A and the conductive block 105.

In some embodiments, the first interconnect structure 240 includes a transparent conductive material, such as conductive oxide (for example, indium tin oxide, indium zinc oxide, aluminum tin oxide, aluminum zinc oxide, indium gallium zinc oxide, or a combination of the materials). Therefore, even if the first interconnect structure 240 covers the top surface of the first light-emitting element 200A, it will not have a great impact on brightness of the display device 30. However, the disclosure is not limited thereto. In other embodiments, the first interconnect structure 240 includes an opaque conductive material, such as metal. Therefore, an area of the first interconnect structure 240 covering the top surface of the first light-emitting element 200A may be reduced. Furthermore, the first interconnect structure 240 is only in contact with a side of the second electrode 220 of the first light-emitting element 200A to prevent the first interconnection structure 240 from having a great impact on the brightness of the display device 30. In some embodiments, a method of forming the first interconnect structure 240 includes physical vapor deposition, chemical vapor deposition, atomic layer deposition, printing, inkjet, or other suitable methods. In some embodiments, a method of defining a pattern of the first interconnect structure 240 includes, for example, a photolithography process.

In this embodiment, the first interconnect structure 240 is formed on the flat layer 110 and is electrically connected to the circuit substrate 100 through the conductive block 105. However, the disclosure is not limited thereto. In other embodiments, the configuration of the conductive block 105 is omitted, and the first interconnect structure 240 is in contact with the second pad 102*b* along a top of the flat layer 110 through the opening of the flat layer 110 at the second pad 102*b*.

Figure 17A:
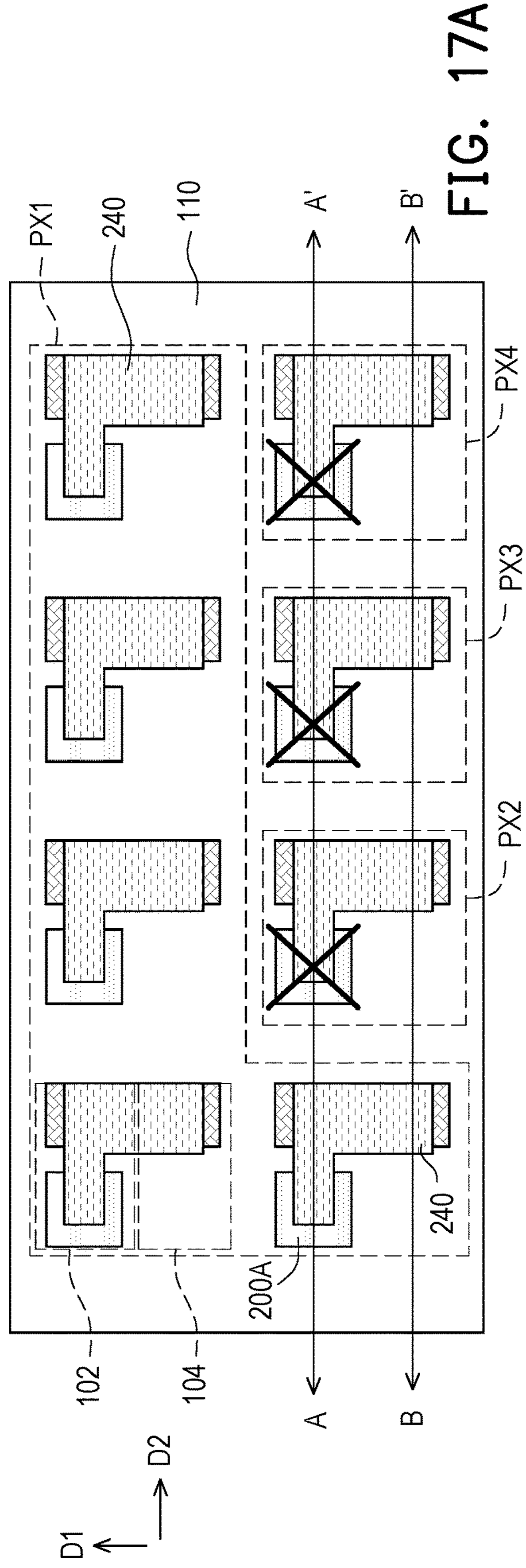
Figure 17B:
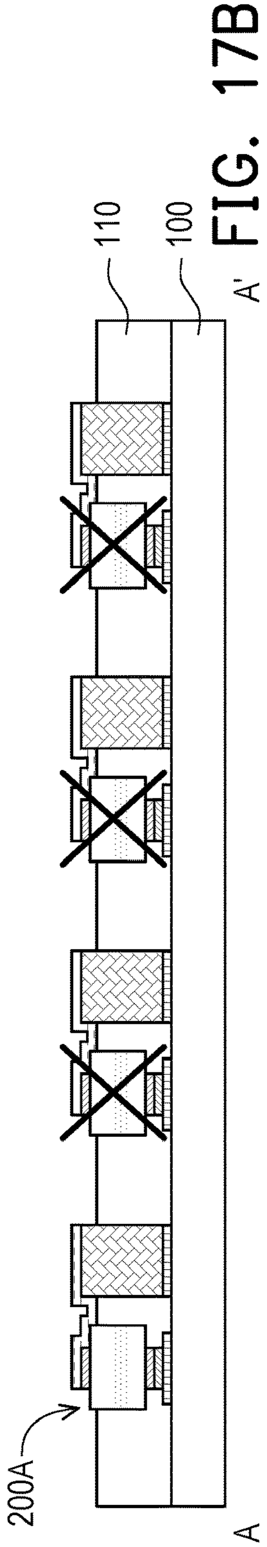
Figure 17C:
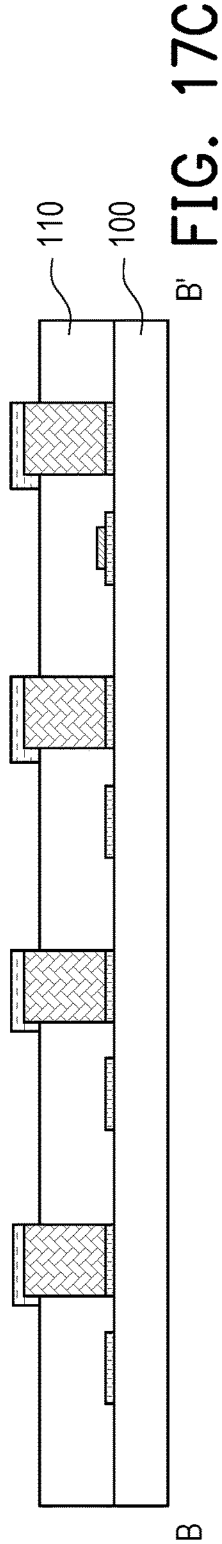

After the first interconnect structure 240 is formed, the display device 30 is obtained. The detection procedure is performed on the display device 30 to check whether the first light-emitting elements 200A are correctly electrically connected to a circuit substrate 300. Referring to FIGS. 17A to 17C, after the first interconnect structure 240 is formed, the sub-pixels in the display device 30 are detected.

After the detection procedure, it is found that the sub-pixels include the first sub-pixel PX1 where the first light-emitting elements 200A are bonded normally and the second sub-pixel PX2, the third sub-pixel PX3, and the fourth sub-pixel PX4 where the first light-emitting elements 200A do not emit the light correctly. The first light-emitting elements 200A on the second sub-pixel PX2, the third sub-pixel PX3, and the fourth sub-pixel PX4 fail to operate correctly, which may be caused by defects in the first light-emitting element 200A on the second sub-pixel PX2, the third sub-pixel PX3, and the fourth sub-pixel PX4, the failure of the soldering process, or breakage of the first interconnect structure 240.

Figure 18A:
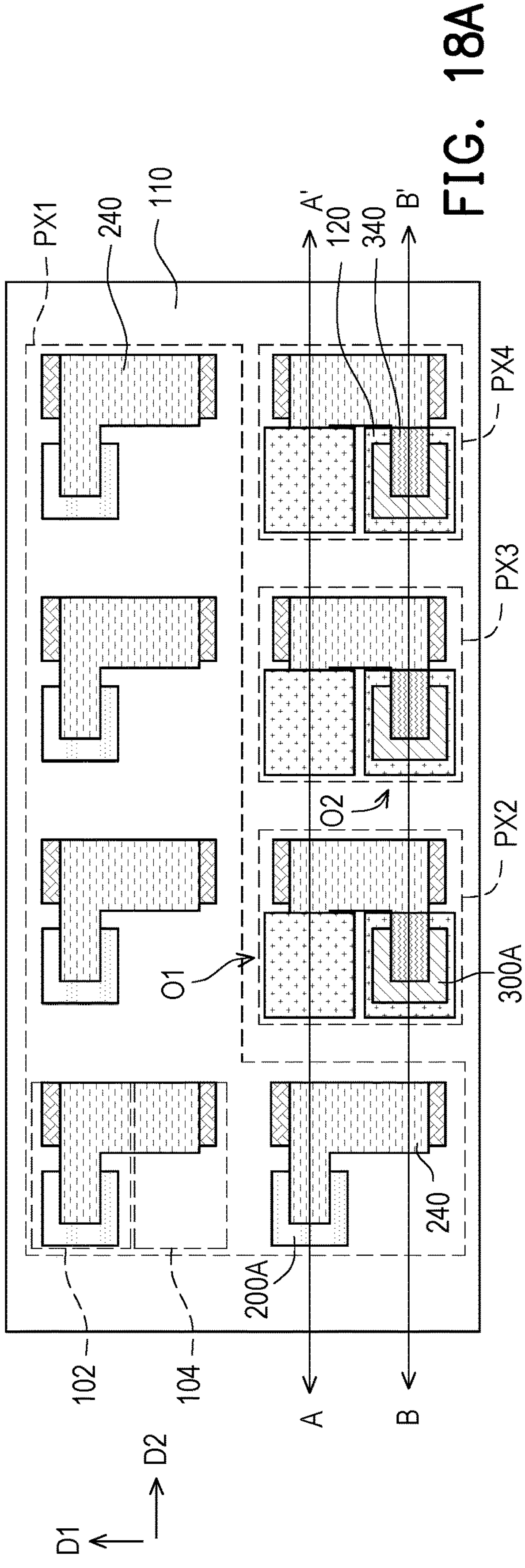
Figure 18B:
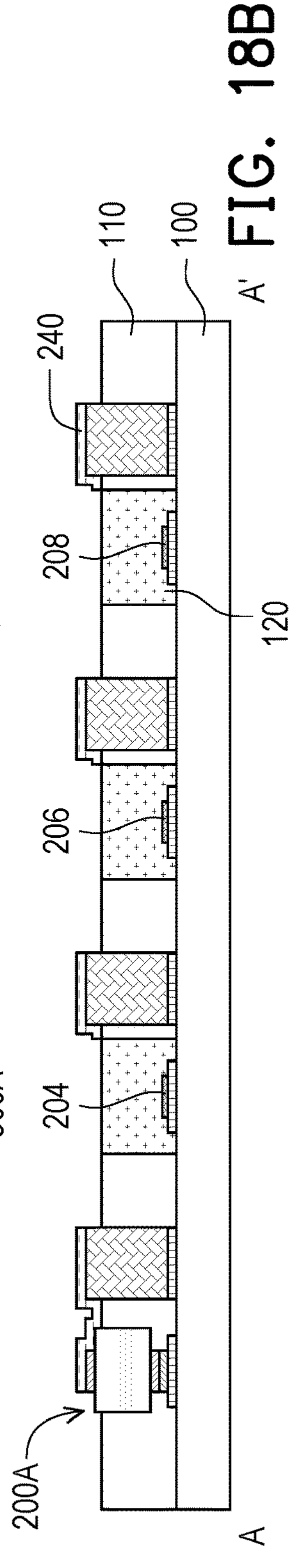
Figure 18C:
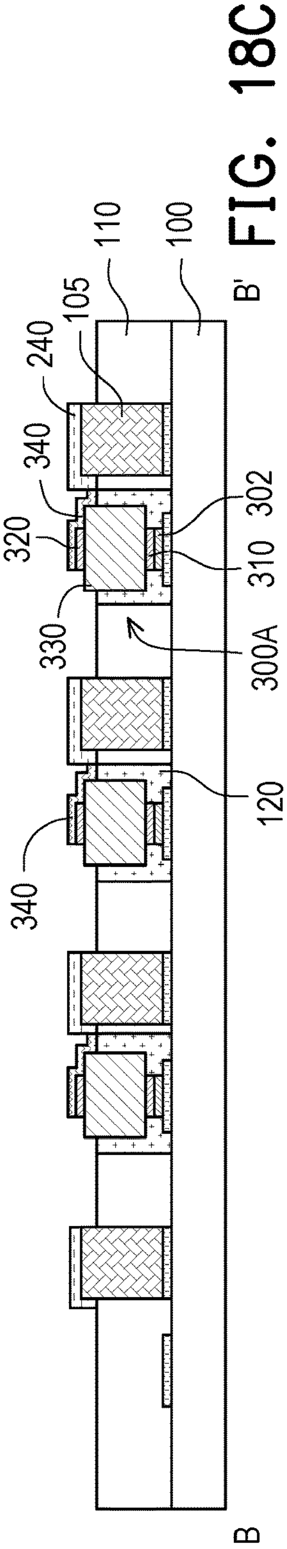

The repair process shown in FIGS. 18A to 18C will be performed on the faulty second sub-pixel PX2, third sub-pixel PX3, and fourth sub-pixel PX4.

Referring to FIGS. 18A to 18C, the first light-emitting elements 200A on the first bonding areas 102 of the second sub-pixel PX2, the third sub-pixel PX3, and the fourth sub-pixel PX4 are removed. After the faulty first light-emitting elements 200A on the first bonding areas 102 of the second sub-pixel PX2, the third sub-pixel PX3, and the fourth sub-pixel PX4 are removed, the first residual solder 204 is on the first pad 102*a* and the second pad 102*b* of the first bonding area 102 of the second sub-pixel PX2, the second residual solder 206 is on the first pad 102*a* and the second pad 102*b* of the first bonding area 102 of the third sub-pixel PX3, and the fourth residual solder 208 is on the first pad 102*a* and the second pad 102*b* of the first bonding area 102 of the fourth sub-pixel PX4.

In some embodiments, when the faulty first light-emitting elements 200A are removed, a first portion of the flat layer 110 surrounding the faulty first light-emitting elements 200A is also removed. For example, the faulty first light-emitting elements 200A and the first portion of the flat layer 110 located therearound are removed to form multiple first openings O1. The first openings O1 are respectively located on the first bonding areas 102 of the second sub-pixel PX2, the third sub-pixel PX3, and the fourth sub-pixel PX4. In some embodiments, processes of removing the first light-emitting element 200A and forming the first opening O1 include a laser trimming process. In some embodiments, when the first opening O1 is formed, a portion of the first interconnect structure 240 on the first portion of the flat layer 110 is also removed.

A second portion of the flat layer 110 is removed to form multiple second openings O2 to expose the second bonding areas 104 of the second sub-pixel PX2, the third sub-pixel PX3, and the fourth sub-pixel PX4. The second openings O2 are respectively located on the second bonding areas 104 of the second sub-pixel PX2, the third sub-pixel PX3, and the fourth sub-pixel PX4. In some embodiments, a method of forming the second opening O2 also includes the laser trimming process. In this embodiment, the first opening O1 and the second opening O2 corresponding to the same sub-pixel are separated from each other, but the disclosure is not limited thereto. In other embodiments, the first opening O1 and the second opening O2 corresponding to the same sub-pixel are connected to each other.

Then, multiple second light-emitting elements 300A are respectively disposed in the second openings O2 on the second bonding areas 104 of the second sub-pixel PX2, the third sub-pixel PX3, and the fourth sub-pixel PX4. The second light-emitting elements 300A are bonded to the circuit substrate 100 through the second solder structure 302.

The second light-emitting element 300A is a micro light emitting diode or a mini light emitting diode. In some embodiments, the second light-emitting element 300A is a vertical light emitting diode, which includes the first electrode 310, the second electrode 320, and the semiconductor stack 330. In some embodiments, the semiconductor stack 330 includes the stack of N-type semiconductors and P-type semiconductors. The first electrode 310 and the second electrode 320 are electrically connected to the N-type semiconductors and the P-type semiconductors respectively. In some embodiments, the semiconductor stack 330 further includes the light-emitting layer between the N-type semiconductors and the P-type semiconductors. In some embodiments, the second light-emitting element 300A includes light emitting diodes of different colors. For example, the second light-emitting element 300A includes red light emitting diodes, green light emitting diodes, blue light emitting diodes, and/or or light emitting diodes of other colors. The light emitting diodes of different colors may include different semiconductor materials. In some embodiments, the colors of the second light-emitting element 300A on the second sub-pixel PX2, the third sub-pixel PX3, and the fourth sub-pixel PX4 are respectively the same as the colors of the first light-emitting elements 200A originally intended to be disposed on the second sub-pixel PX2, the third sub-pixel PX3, and the fourth sub-pixel PX4. For example, when the red first light-emitting elements 200A is damaged, the red second light-emitting element 300A is used for repair. When the green first light-emitting elements 200A is damaged, the green second light-emitting element 300A is used for repair. When the blue first light-emitting elements 200A is damaged, the blue second light-emitting element 300A is used for repair.

A first filling material 120 is formed in the first opening O1 and the second opening O2. The first filling material 120 is filled between the second light-emitting element 300A and the flat layer 110. In some embodiments, a method of forming the first filling material 120 includes inkjet, dispensing, or other suitable processes. In some embodiments, the first filling material 120 includes epoxy resin, silicone, acrylic, or other suitable materials, and the first filling material 120 optionally includes carbon black, scattering particles, or other filling particles. The first filling material 120 and the flat layer 110 may include the same or different materials.

A second interconnect structure 340 is formed on the flat layer 110 and the first filling material 120. The second interconnect structure 340 is electrically connected to the second light-emitting element 300A and the conductive block 105. For example, the second interconnect structure 340 electrically connects the second light-emitting element 300A to the first interconnect structure 240, thereby electrically connected to the conductive block 105 through the first interconnect structure 240. In this embodiment, the second interconnect structure 340 is formed on the flat layer 110 and the first filling material 120. However, the disclosure is not limited thereto.

Figures 19A, 19B, 19C:
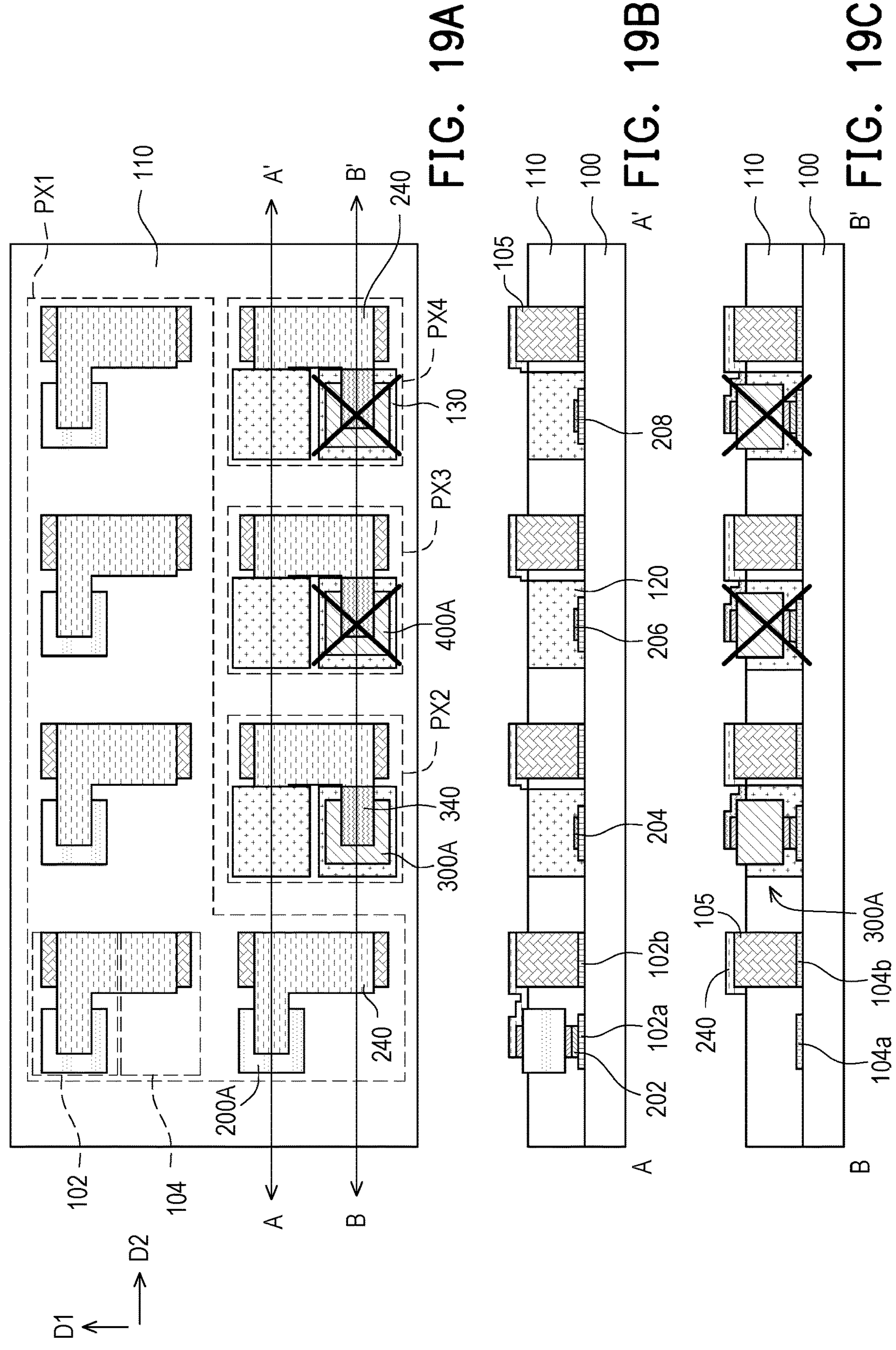

After the second interconnect structure 340 is formed, a display device 30' that has been repaired once is obtained. The detection procedure is performed on the display device 30' that has been repaired once to check whether the second light-emitting elements 300A are correctly bonded to the circuit substrate 100. Referring to FIGS. 19A to 19C, after the second interconnect structure 340 is formed, the sub-pixels in the display device 30' that has been repaired once are detected.

After the detection procedure, it is found that the second light-emitting elements 300A on the second sub-pixel PX2 are normally bonded to the circuit substrate 100, but the second light-emitting elements 300A on the third sub-pixel PX3 and the fourth sub-pixel PX4 do not emit the light correctly, which may be caused by defects in the second light-emitting elements 300A on the third sub-pixel PX3 and the fourth sub-pixel PX4, the failure of the soldering process, or breakage of the second interconnect structure 340.

Figures 20A, 20B, 20C:
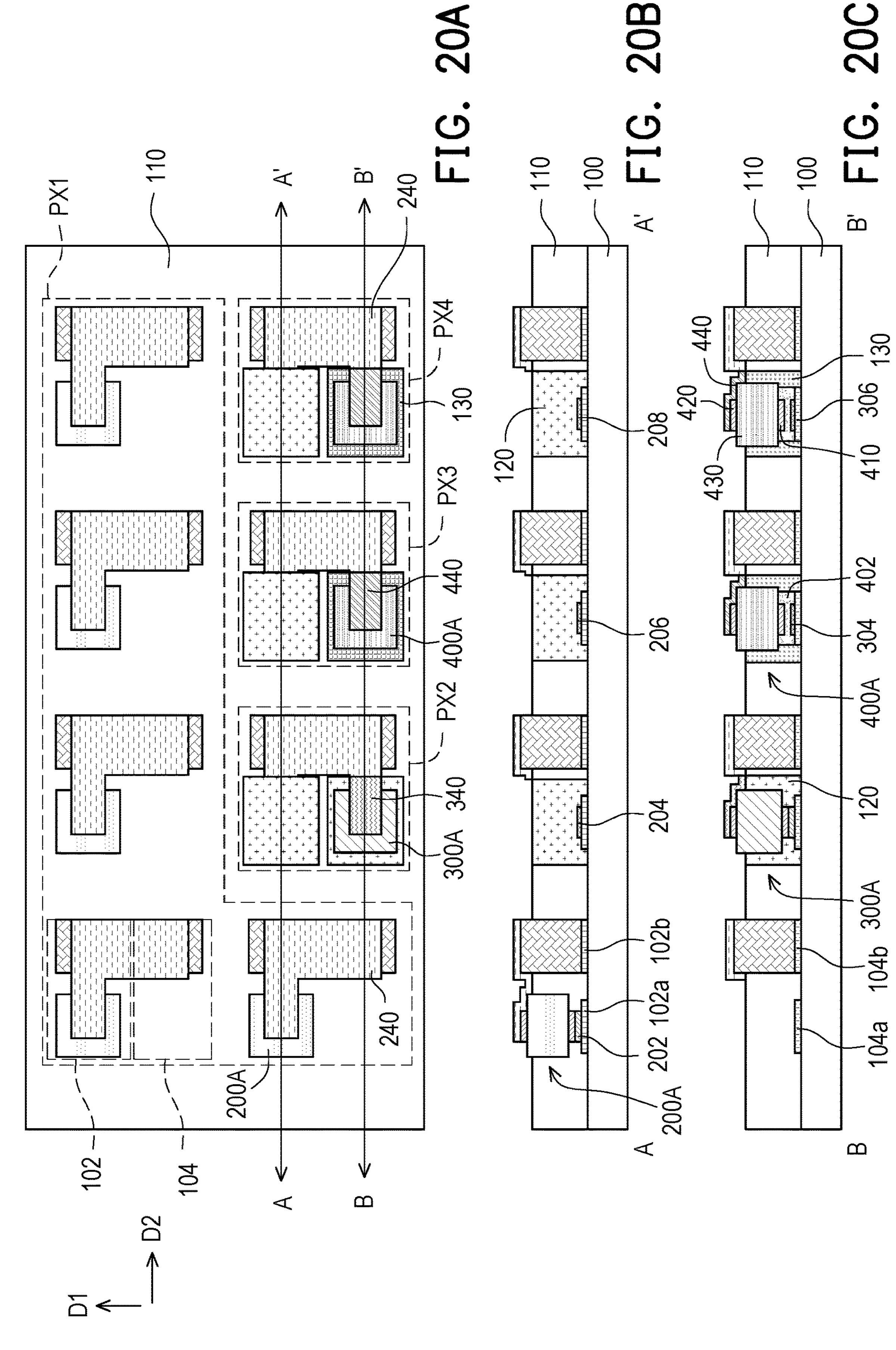

The repair process shown in FIGS. 20A to 20C will be performed on the faulty third sub-pixel PX3 and fourth sub-pixel PX4.

Referring to FIGS. 20A to 20C, the second light-emitting elements 300A on the second bonding areas 104 of the third sub-pixel PX3 and the fourth sub-pixel PX4 are removed. After the faulty second light-emitting elements 300A on the second bonding areas 104 of the third sub-pixel PX3 and the fourth sub-pixel PX4 are removed, the third residual solder 304 is on the first repair pad 104*a* of the second bonding area 104 of the third sub-pixel PX3, and the fifth residual solder 306 is on the first repair pad 104*a* of the second bonding area 104 of the fourth sub-pixel PX4.

In some embodiments, when the faulty second light-emitting elements 300A are removed, the first filling material 120 surrounding the faulty second light-emitting elements 300A is also removed. For example, the faulty second light-emitting elements 300A and the first filling material 120 located therearound are removed. In some embodiments, a process of removing the second light-emitting elements 300A and the first filling material 120 surrounding therearound includes the laser trimming process. In some embodiments, when the first filling material 120 is removed, the second interconnect structure 340 located thereon is also completely or partially removed. In some embodiments, the first filling material 120 around the second light-emitting element 300A is completely or partially removed.

After the first filling material 120 and the faulty second light-emitting elements 300A in the third sub-pixel PX3 and the fourth sub-pixel PX4 are removed, the second bonding areas 104 of the third sub-pixel PX3 and the fourth sub-pixel PX4 are exposed.

In this embodiment, the second residual solder 206 on the first bonding area 102 of the third sub-pixel PX3 is separated from the third residual solder 304 on the second bonding area 104, and the fourth residual solder 208 on the first bonding area 102 of the fourth sub-pixel PX4 is separated from the fifth residual solder 306 on the second bonding area 104.

The first conductive adhesive structure 402 is placed on the third sub-pixel PX3 and the fourth sub-pixel PX4. In this embodiment, the first conductive adhesive structure 402 is respectively disposed on the second bonding area 104 of the third sub-pixel PX3 and the second bonding area 104 of the fourth sub-pixel PX4, covering the first repair pad 104*a* and directly in contact with the third residual solder 304 and the fifth residual solder 306 located thereon. In other embodiments, the first conductive adhesive structure 402 is respectively disposed on the first bonding area 102 of the third sub-pixel PX3 and the first bonding area 102 of the fourth sub-pixel PX4, covering the first pad 102*a* and directly in contact with the second residual solder 206 and the fourth residual solder 208 located thereon.

Subsequently, multiple third light-emitting elements 400A are respectively disposed on the third sub-pixel PX3 and the fourth sub-pixel PX4. The first electrode 410 of the third light-emitting elements 400A are electrically connected to the third sub-pixel PX3 and the fourth sub-pixel PX4 of the circuit substrate 100 through the first conductive adhesive structures 402. In this embodiment, the third light-emitting elements 400A are electrically connected to the first repair pad 104*a*. In other embodiments, the repair process is performed on the first bonding area 102, and the third light-emitting elements 400A are electrically connected to the first pad 102*a*. In some embodiments, the third light-emitting elements 400A are bonded to the first conductive adhesive structure 402 by applying pressure and heating.

The third light-emitting element 400A is a micro light emitting diode or a mini light emitting diode. In some embodiments, the third light-emitting element 400A is a vertical light emitting diode, which includes the first electrode 410, the second electrode 420, and the semiconductor stack 430. In some embodiments, the semiconductor stack 430 includes the stack of N-type semiconductors and P-type semiconductors. The first electrode 410 and the second electrode 420 are electrically connected to the N-type semiconductors and the P-type semiconductors respectively. In some embodiments, the semiconductor stack 430 further includes the light-emitting layer between the N-type semiconductors and the P-type semiconductors. In some embodiments, the third light-emitting element 400A includes light emitting diodes of different colors. For example, the third light-emitting element 400A includes red light emitting diodes, green light emitting diodes, blue light emitting diodes, and/or or light emitting diodes of other colors. The light emitting diodes of different colors may include different semiconductor materials. In some embodiments, the colors of the third light-emitting element 400A on the third sub-pixel PX3 and the fourth sub-pixel PX4 are respectively the same as the colors of the second light-emitting element 300A (or the first light-emitting element 200A) originally intended to be disposed on the third sub-pixel PX3 and the fourth sub-pixel PX4. For example, when the red second light-emitting element 300A is damaged, the red third light-emitting element 400A is used for repair. When the green second light-emitting element 300A is damaged, the green third light-emitting element 400A is used for repair. When the blue second light-emitting element 300A is damaged, the blue third light-emitting element 400A is used for repair.

Generally speaking, the residual solder on the pad includes the intermetallic compounds, which will hinder the soldering process on the pad. In this embodiment, the first conductive adhesive structure 402 is used to perform the second repair process, instead of using the soldering process to perform the second repair process. Therefore, even if there is residual solder on the pad, the light emitting diode may still be electrically connected to the circuit substrate 100 through the first conductive adhesive structure 402.

In this embodiment, the third light-emitting elements 400A are disposed on the second bonding areas 104 of the third sub-pixel PX3 and the fourth sub-pixel PX4, which helps to prevent a configuration process of the third light-emitting elements 400A from being affected by a relatively high number of normal light-emitting elements. That is, the third light-emitting element 400A has a greater repair and transposition space. In other embodiments, the third light-emitting elements 400A may be optionally disposed on the first bonding areas 102 of the third sub-pixel PX3 and the fourth sub-pixel PX4.

A second filling material 130 is formed between the third light-emitting element 400A and the flat layer 110. In some embodiments, a method of forming the second filling material 130 includes inkjet, dispensing, or other suitable processes. In some embodiments, the second filling material 130 includes epoxy resin, silicone, acrylic, or other suitable materials, and the second filling material 130 optionally includes carbon black, scattering particles, or other filling particles. The second filling material 130 and the flat layer 110 may include the same or different materials. The second filling material 130 covers the first conductive adhesive structure 402.

A third interconnect structure 440 is formed on the flat layer 110 and the second filling material 130. The third interconnect structure 440 is electrically connected to the third light-emitting element 400A and the conductive block 105. For example, the third interconnect structure 440 electrically connects the third light-emitting element 400A to the first interconnect structure 240, thereby electrically connected to the conductive block 105 through the first interconnect structure 240. In this embodiment, the third interconnect structure 440 is formed on the flat layer 110 and the second filling material 130. However, the disclosure is not limited thereto.

Figures 21A, 21B, 21C:
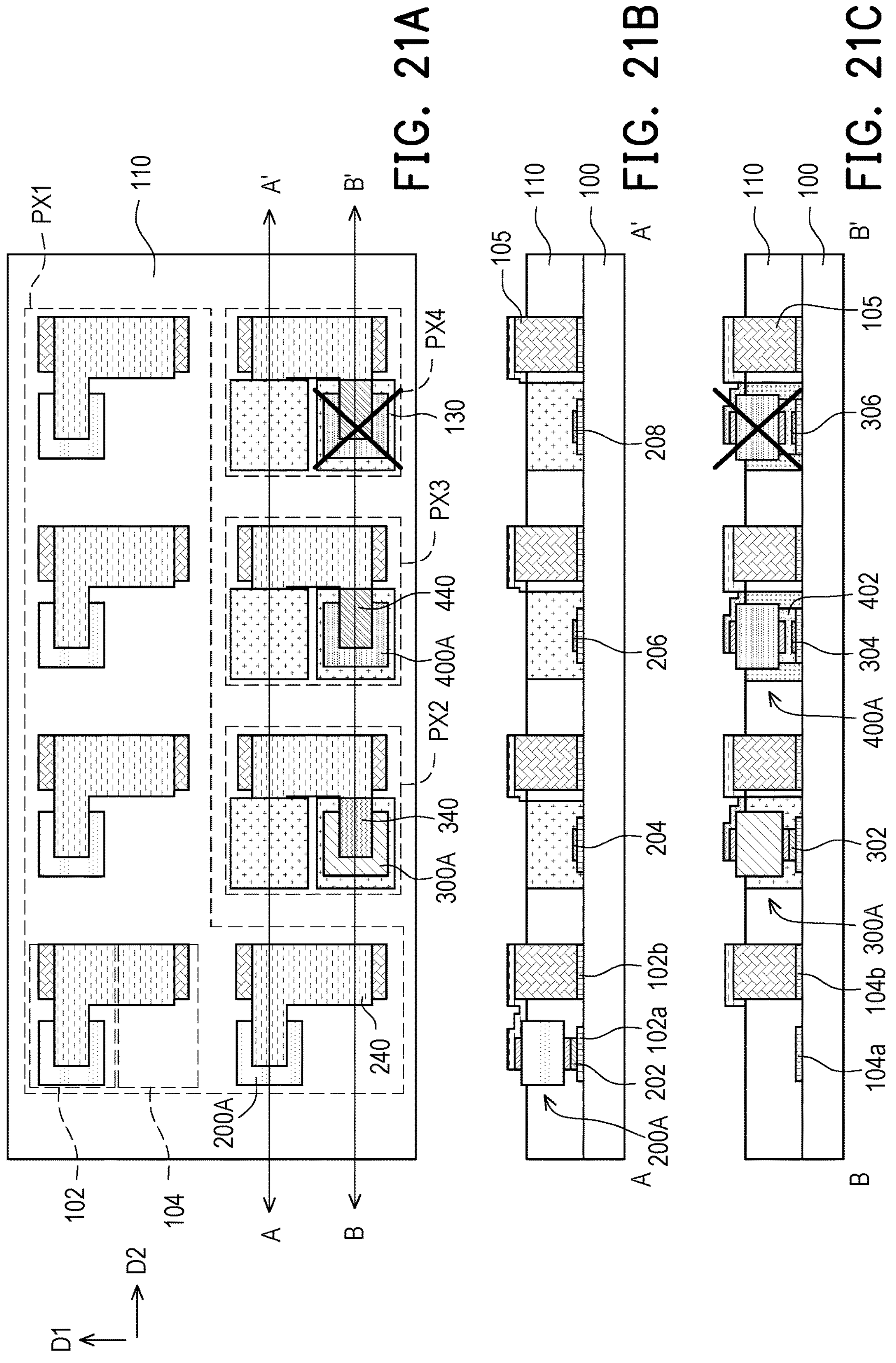

After the third interconnect structure 440 is formed, a display device 30" that has been repaired twice is obtained. The detection procedure is performed on the display device 30" that has been repaired twice to check whether the third light-emitting elements 400A are correctly bonded to the circuit substrate 100. Referring to FIGS. 21A to 21C, after the third interconnect structure 440 is formed, the sub-pixels in the display device 30" has been repaired twice are detected.

After the detection procedure, it is found that the third light-emitting elements 400A on the third sub-pixel PX3 are normally bonded to the circuit substrate 100, but the third light-emitting elements 400A on the fourth sub-pixel PX4 do not emit the light correctly, which may be caused by defects in the third light-emitting elements 400A on the fourth sub-pixel PX4, the failure of the soldering process, or breakage of the third interconnect structure 440.

Figures 22A, 22B, 22C:
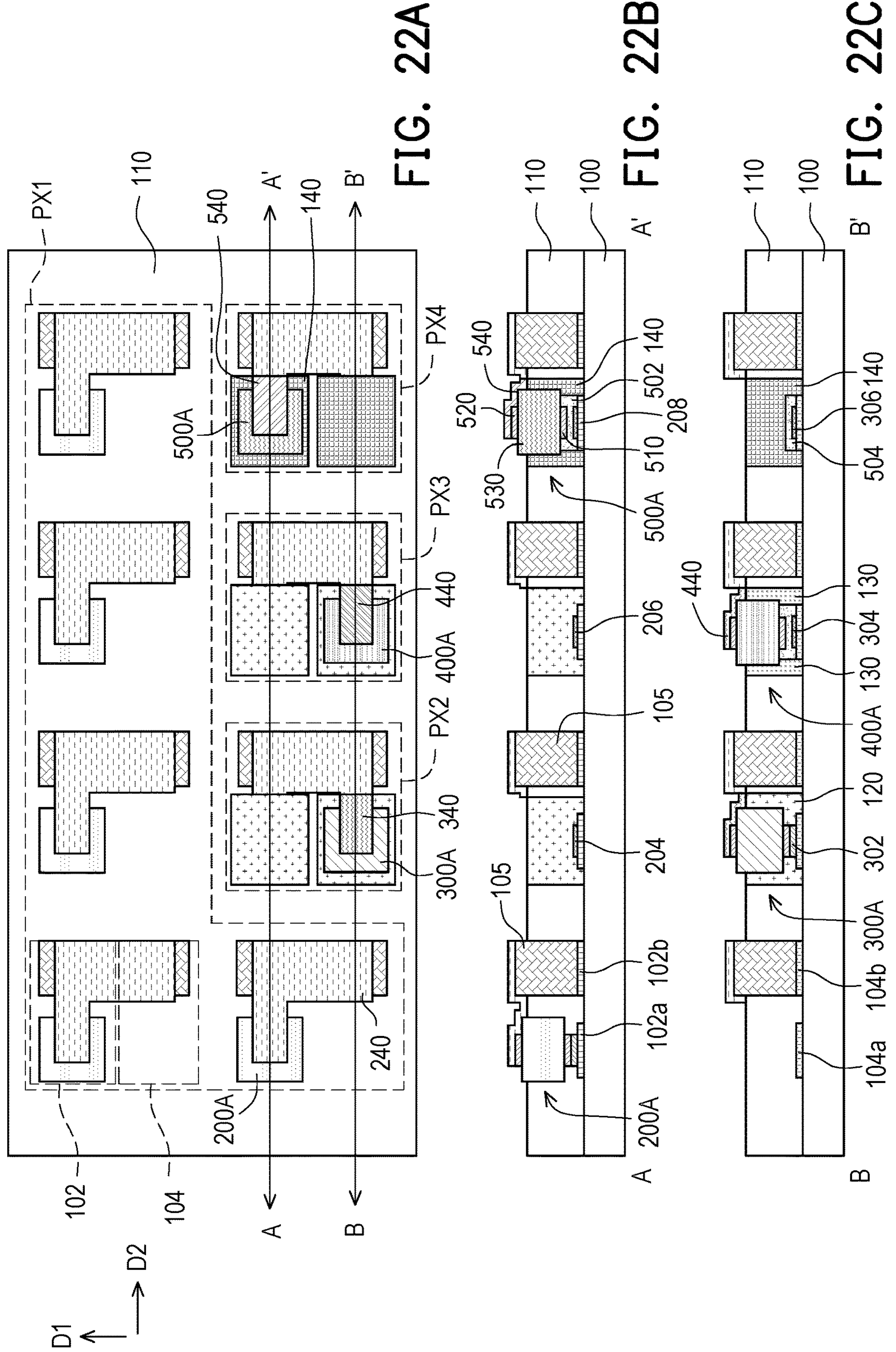

The repair process shown in FIGS. 22A to 22C will be performed on the faulty fourth sub-pixel PX4.

Referring to FIGS. 22A to 22C, the third light-emitting elements 400A on the second bonding area 104 of the fourth sub-pixel PX4 are removed. After the faulty third light-emitting elements 400A on the second bonding area 104 of the fourth sub-pixel PX4 are removed, the residual conductive adhesive 504 is on the first repair pad 104*a* of the second bonding area 104 of the fourth sub-pixel PX4.

In some embodiments, when the faulty third light-emitting elements 400A are removed, the second filling material 130 surrounding the faulty third light-emitting elements 400A is also removed. For example, the faulty third light-emitting elements 400A and the second filling material 130 located therearound are removed. In some embodiments, a process of removing the third light-emitting elements 400A and the second filler material 130 surrounding therearound includes the laser trimming process. In some embodiments, when the second filling material 130 is removed, the third interconnect structure 440 located thereon is also completely or partially removed. In some embodiments, the second filler material 130 surrounding the faulty third light-emitting elements 400A is completely or partially removed.

In some embodiments, the first filling material 120 in the fourth sub-pixel PX4 is removed to expose the first bonding area 102 of the fourth sub-pixel PX4.

In this embodiment, the third light-emitting elements 400A on the fourth sub-pixel PX4 are bonded to the first repair pad 104*a* through the first conductive adhesive structure 402 (for example, the sheet-shaped ACF). Therefore, an ultraviolet laser of 343 nm is used to remove the third light-emitting elements 400A. However, the disclosure is not limited thereto.

In this embodiment, the residual conductive adhesive 504 is located on the second bonding area 104 of the fourth sub-pixel PX4, and the second conductive adhesive structure 502 is located on the first bonding area 102 of the fourth sub-pixel PX4. However, the disclosure is not limited thereto. In other embodiments, the residual conductive adhesive 504 is located on the first bonding area 102 of the fourth sub-pixel PX4, and the second conductive adhesive structure 502 is located on the second bonding area 104 of the fourth sub-pixel PX4.

Then, fourth light-emitting elements 500A are disposed on the fourth sub-pixel PX4, and are bonded to the circuit substrate 100 through the second conductive adhesive structure 502. The first electrode 510 of the fourth light-emitting element 500A are electrically connected to the fourth sub-pixel PX4 of the circuit substrate 100 through the second conductive adhesive structure 502, for example, are electrically connected to the first pad 102*a*. In some embodiments, the fourth light-emitting elements 500A are bonded to the second conductive adhesive structure 502 by applying pressure and heating.

The fourth light-emitting element 500A is a micro light emitting diode or a mini light emitting diode. In some embodiments, the fourth light-emitting element 500A is a flip-chip LED, which includes the first electrode 510, the second electrode 520, and a semiconductor stack 530. In some embodiments, the semiconductor stack 530 includes the stack of N-type semiconductors and P-type semiconductors. The first electrode 510 and the second electrode 520 are electrically connected to the N-type semiconductors and the P-type semiconductors respectively. In some embodiments, the semiconductor stack 530 further includes the light-emitting layer between the N-type semiconductors and the P-type semiconductors. In some embodiments, the fourth light-emitting element 500A includes light emitting diodes of different colors. For example, the fourth light-emitting element 500A includes red light emitting diodes, green light emitting diodes, blue light emitting diodes, and/or or light emitting diodes of other colors. The light emitting diodes of different colors may include different semiconductor materials. In some embodiments, the colors of the fourth light-emitting element 500A on the fourth sub-pixel PX4 are respectively the same as the colors of the third light-emitting element 400A (or the first light-emitting element 200A) originally intended to be disposed on the fourth sub-pixel PX4. For example, when the red third light-emitting element 400A is damaged, the red fourth light-emitting element 500A is used for repair. When the green third light-emitting element 400A is damaged, the green fourth light-emitting element 500A is used for repair. When the blue third light-emitting element 400A is damaged, the blue fourth light-emitting element 500A is used for repair.

In some embodiments, the second conductive adhesive structure 502 includes anisotropic conductive film, silver adhesive, conductive carbon adhesive, or other suitable adhesive materials, which the operator may select according to the requirements.

A third filling material 140 is formed between the fourth light-emitting element 500A and the flat layer 110. In some embodiments, a method of forming the third filling material 140 includes inkjet, dispensing, or other suitable processes. In some embodiments, the third filling material 140 includes epoxy resin, silicone, acrylic, or other suitable materials, and the third filling material 140 optionally includes carbon black, scattering particles, or other filling particles. The third filling material 140 and the flat layer 110 may include the same or different materials. The third filling material 140 covers the second conductive adhesive structure 502.

A fourth interconnect structure 540 is formed on the flat layer 110 and the third filling material 140. The fourth interconnect structure 540 is electrically connected to the fourth light-emitting element 500A and the conductive block 105. For example, the fourth interconnect structure 540 electrically connects the fourth light-emitting element 500A to the first interconnect structure 240, thereby electrically connected to the conductive block 105 through the first interconnect structure 240. In this embodiment, the fourth interconnect structure 540 is formed on the flat layer 110 and the third filling material 140. However, the disclosure is not limited thereto.

After the fourth interconnect structure 540 is formed, the display device 30''' that has been repaired three times is obtained.

Based on the above, even if the pad (or the repair pad) includes the residual solder with the intermetallic compounds, the first conductive adhesive structure 402 may still be used to perform the second repair, or even the second conductive adhesive structure 502 may be used to perform the third repair. Therefore, more repair processes may be used to reduce defective pixels in the display device 30'''.

Figure 23A:
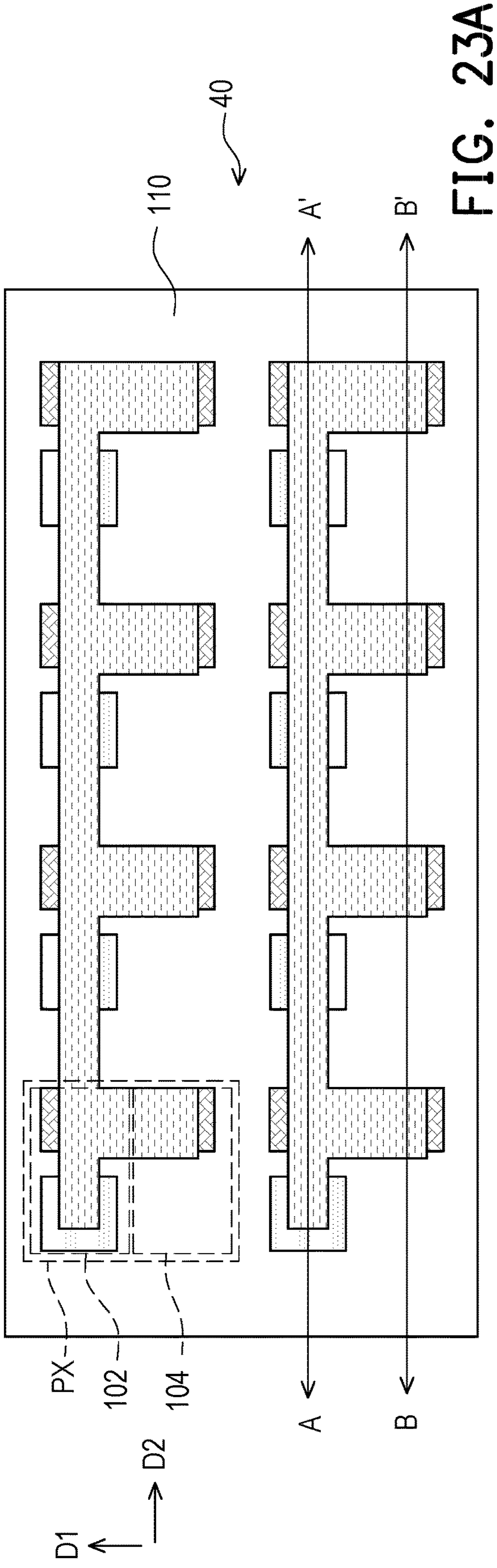
FIGS. 23A, 24A, 25A, 26A, 27A, 28A, and 29A are schematic top views of a manufacturing method of a display device according to an embodiment of the disclosure.

FIGS. 23A to 29C are various views of a manufacturing method of a display device 40''' according to an embodiment of the disclosure. Specifically, FIGS. 23A to 23C are schematic views of a display device 30. When it is found that some pixels in the display device 40 are faulty, the repair process shown in FIGS. 24A to 29C may be adopted to obtain a repaired display device 40'''.

It is noted that some of the reference numerals and descriptions of the embodiments of FIGS. 12A to 22C will apply to the embodiments of FIGS. 23A to 29C. The same reference numerals will represent the same or similar components and the descriptions of the same technical contents will be omitted. Reference may be made to the above embodiment for the omitted descriptions, which will not be repeated in the following embodiments.

Figure 23B:
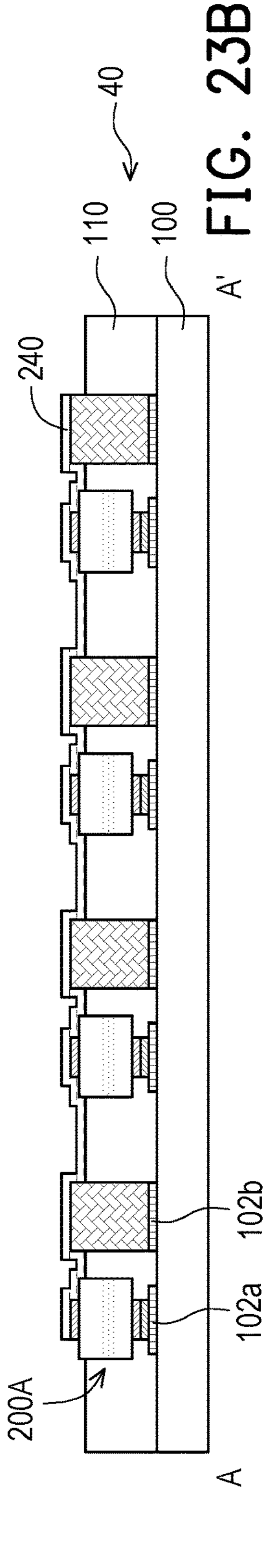
FIGS. 23B, 24B, 25B, 26B, 27B, 28B, and 29B are schematic cross-sectional views taken along the line A-A' in FIGS. 23A, 24A, 25A, 26A, 27A, 28A, and 29A respectively.
Figure 23C:
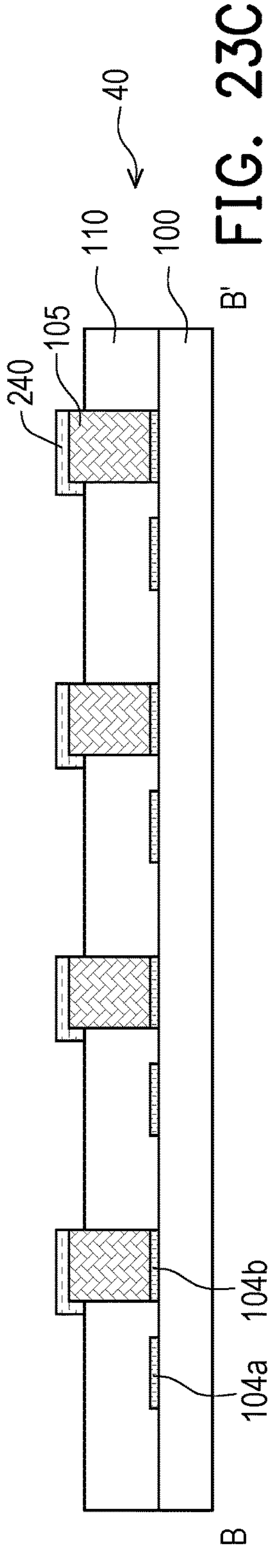
FIGS. 23C, 24C, 25C, 26C, 27C, 28C, and 29C are schematic cross-sectional views taken along the line B-B' in FIGS. 23A, 24A, 25A, 26A, 27A, 28A, and 29A respectively.

The display device 40 in FIGS. 23A to 23C is similar to the display device 30 in FIGS. 16A to 16C. A difference is that the first interconnect structure 240 of the display device 40 connects the conductive blocks 105 together in series.

Figure 24A:
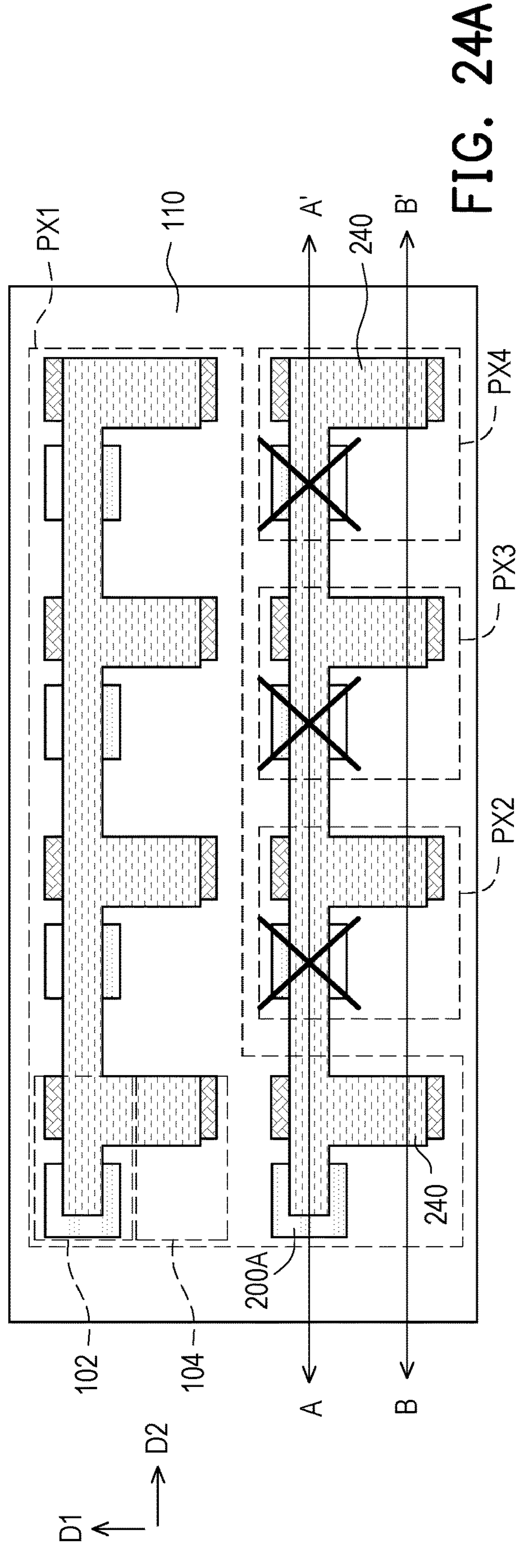
Figure 24B:
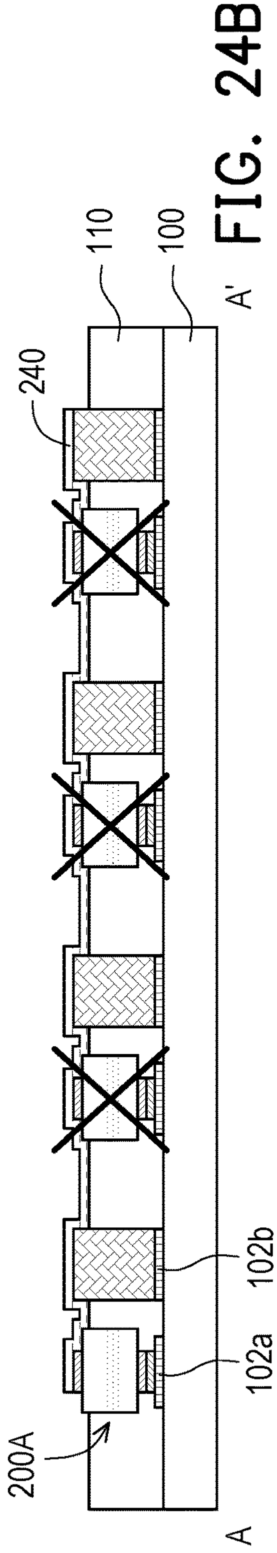
Figure 24C:
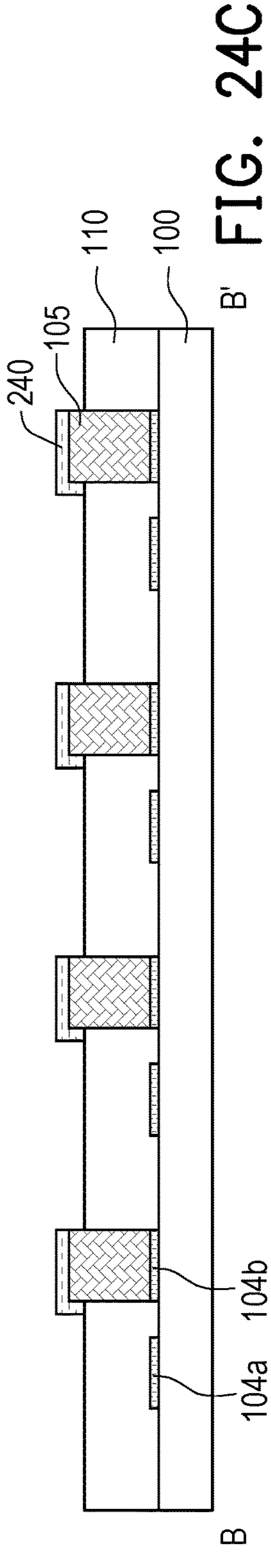

Referring to FIGS. 24A to 24C, the sub-pixels in the display device 40 are detected. After the detection procedure, it is found that the sub-pixels include the first sub-pixel PX1 where the first light-emitting elements 200A are bonded normally and the second sub-pixel PX2, the third sub-pixel PX3, and the fourth sub-pixel PX4 where the first light-emitting elements 200A do not emit light correctly.

Figures 25A, 25B, 25C:
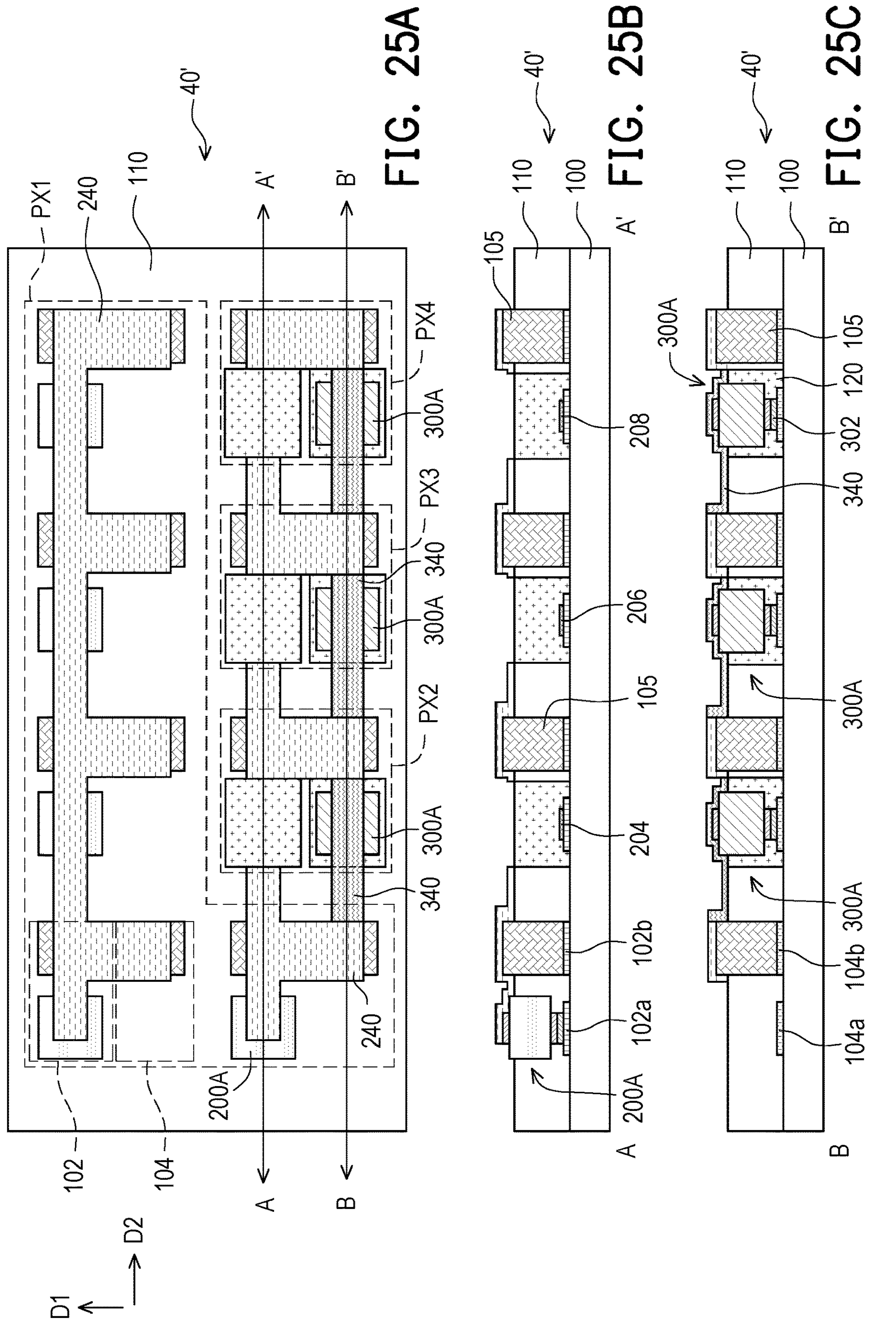

Referring to FIGS. 25A to 25C, the faulty first light-emitting elements 200A on the first bonding areas 102 of the second sub-pixel PX2, the third sub-pixel PX3, and the fourth sub-pixel PX4 are removed. At the same time, a portion of the flat layer 110 on the second sub-pixel PX2, the third sub-pixel PX3, and the fourth sub-pixel PX4 is removed.

The second light-emitting elements 300A are respectively disposed on the second bonding areas 104 of the second sub-pixel PX2, the third sub-pixel PX3, and the fourth sub-pixel PX4. The second light-emitting elements 300A are bonded to the circuit substrate 100 through the second solder structure 302.

The first filling material 120 is formed between the second light-emitting element 300A and the flat layer 110.

The second interconnect structure 340 is formed on the flat layer 110 and the first filling material 120. The second interconnect structure 340 is electrically connected to the second light-emitting element 300A and the conductive block 105.

Figures 26A, 26B, 26C:
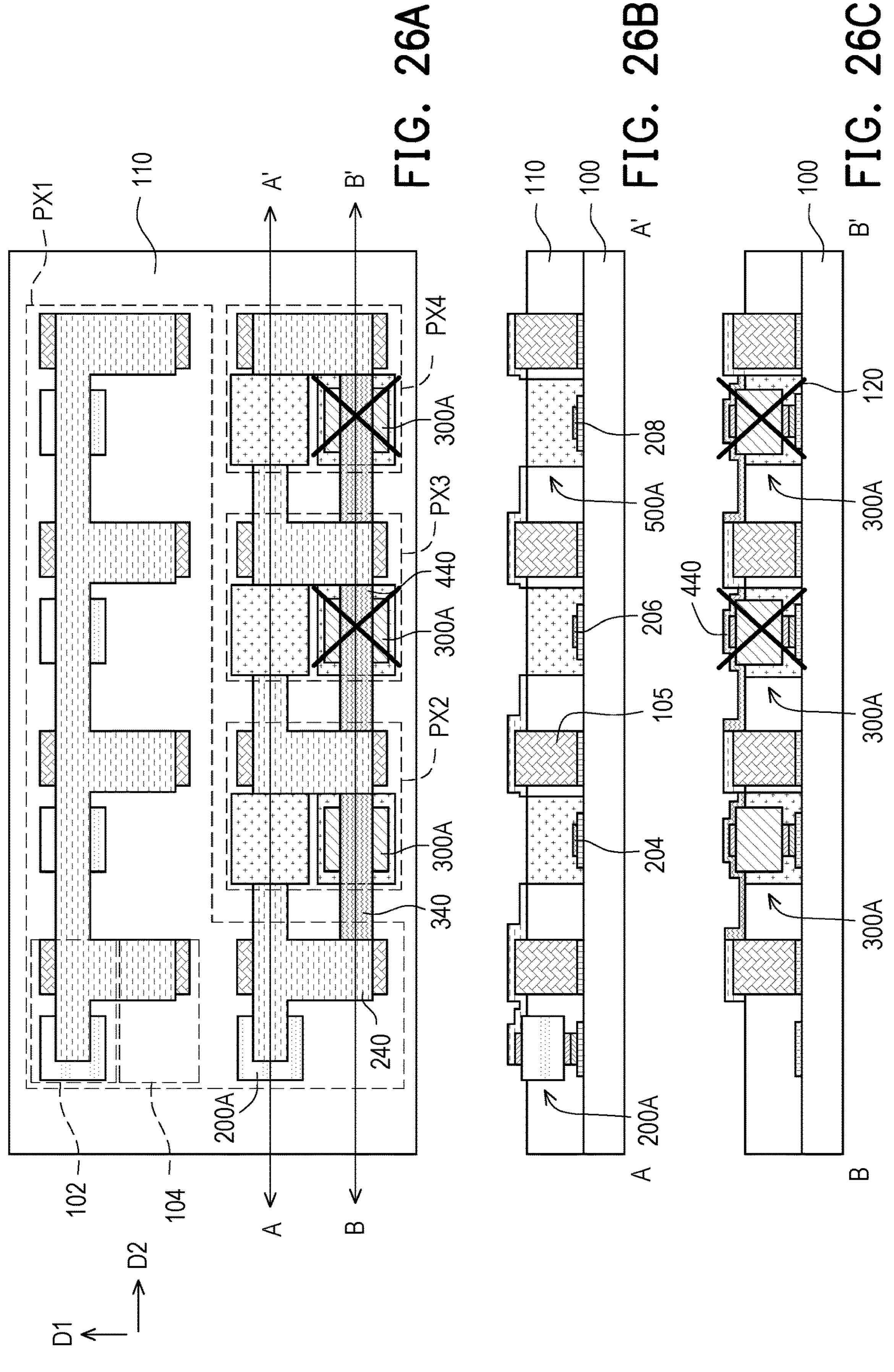

After the second interconnect structure 340 is formed, a display device 40' that has been repaired once is obtained. The detection procedure is performed on the display device 40' that has been repaired once to check whether the second light-emitting elements 300A are correctly bonded to the circuit substrate 100. Referring to FIGS. 26A to 26C, after the second interconnect structure 340 is formed, the sub-pixels in the display device 40' that has been repaired once are detected.

After the detection procedure, it was found that the second light-emitting elements 300A on the second sub-pixel PX2 are normally bonded to the circuit substrate 100, but the second light-emitting elements 300A on the third sub-pixel PX3 and the fourth sub-pixel PX4 do not emit the light correctly.

Figures 27A, 27B, 27C:
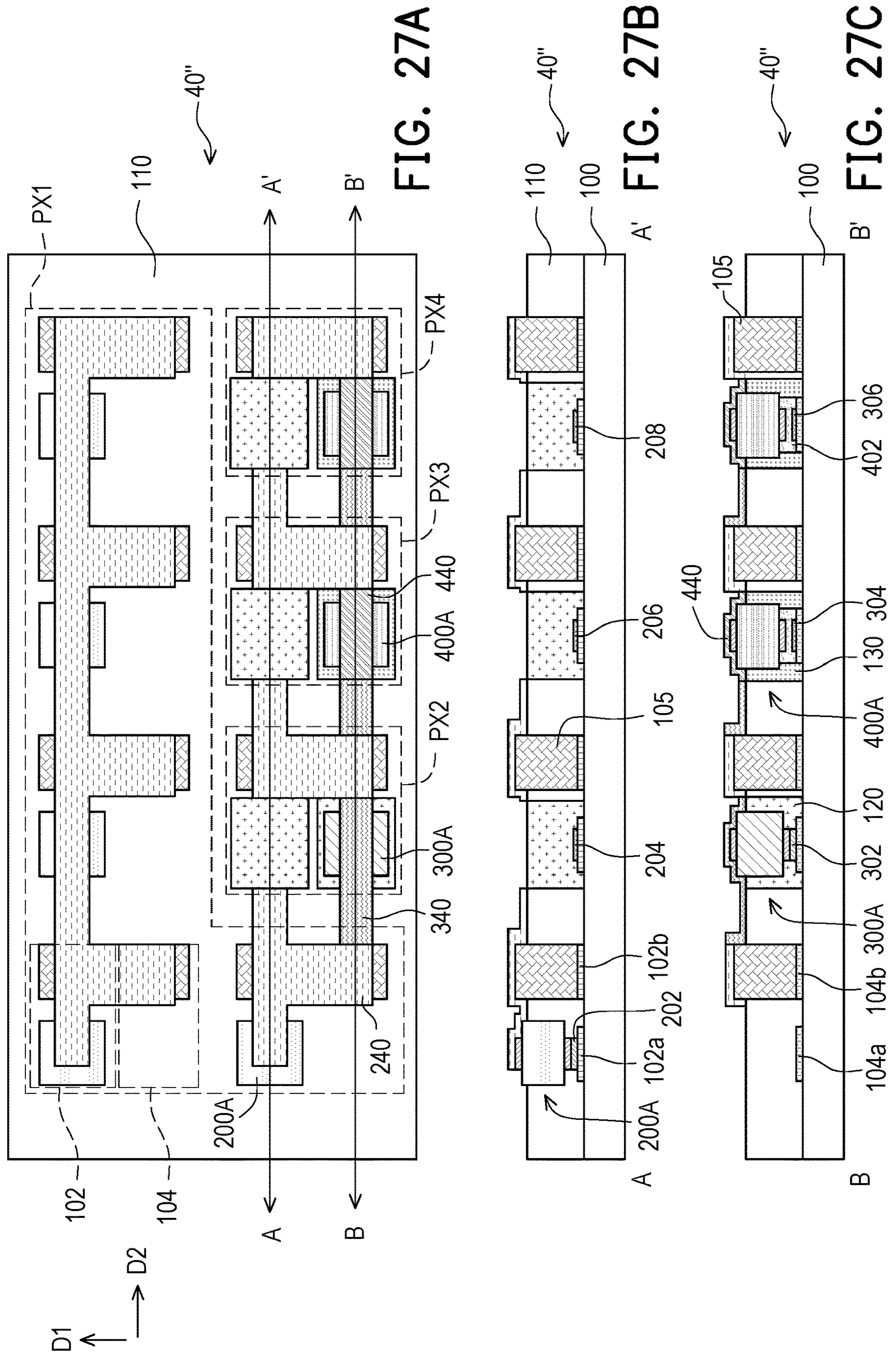

The repair process shown in FIGS. 27A to 27C will be performed on the faulty third sub-pixel PX3 and fourth sub-pixel PX4.

Referring to FIGS. 27A to 27C, the second light-emitting elements 300A on the second bonding areas 104 of the third sub-pixel PX3 and the fourth sub-pixel PX4 are removed.

In some embodiments, when the faulty second light-emitting elements 300A are removed, the first filling material 120 surrounding the faulty second light-emitting elements 300A is also removed. In some embodiments, when the first filling material 120 is removed, the second interconnect structure 340 located thereon is also completely or partially removed.

The first conductive adhesive structure 402 is placed on the third sub-pixel PX3 and the fourth sub-pixel PX4. In this embodiment, the first conductive adhesive structure 402 is respectively disposed on the second bonding area 104 of the third sub-pixel PX3 and the second bonding area 104 of the fourth sub-pixel PX4, covering the first repair pad 104*a* and directly in contact with the third residual solder 304 and the fifth residual solder 306 located thereon. In other embodiments, the first conductive adhesive structure 402 is respectively disposed on the first bonding area 102 of the third sub-pixel PX3 and the first bonding area 102 of the fourth sub-pixel PX4, covering the first pad 102*a* and directly in contact with the second residual solder 206 and the fourth residual solder 208 located thereon.

Subsequently, the third light-emitting elements 400A are respectively disposed on the third sub-pixel PX3 and the fourth sub-pixel PX4. The first electrode 410 of the third light-emitting elements 400A are electrically connected to the third sub-pixel PX3 and the fourth sub-pixel PX4 of the circuit substrate 100 through the first conductive adhesive structures 402.

In this embodiment, the third light-emitting elements 400A are disposed on the second bonding areas 104 of the third sub-pixel PX3 and the fourth sub-pixel PX4. In other embodiments, the third light-emitting elements 400A may be optionally disposed on the first bonding areas 102 of the third sub-pixel PX3 and the fourth sub-pixel PX4.

The second filling material 130 is formed between the third light-emitting element 400A and the flat layer 110.

The third interconnect structure 440 is formed on the flat layer 110 and the second filling material 130. The third interconnect structure 440 is electrically connected to the third light-emitting element 400A and the conductive block 105.

Figure 28A:
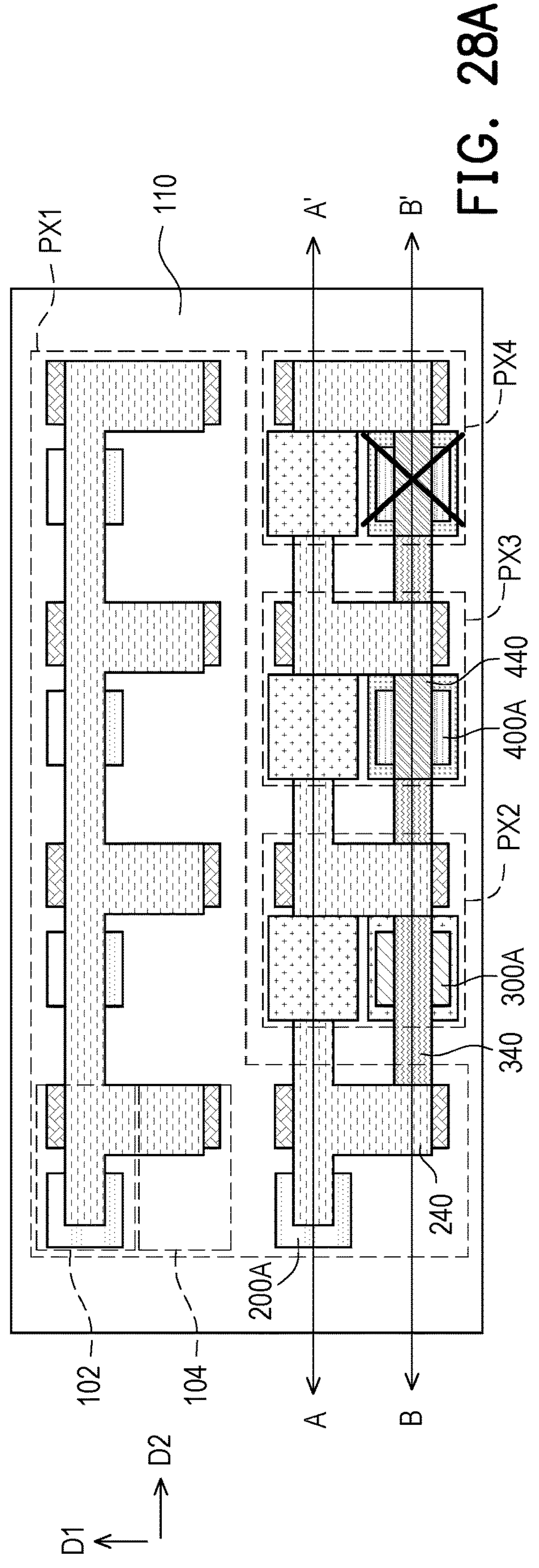
Figure 28B:
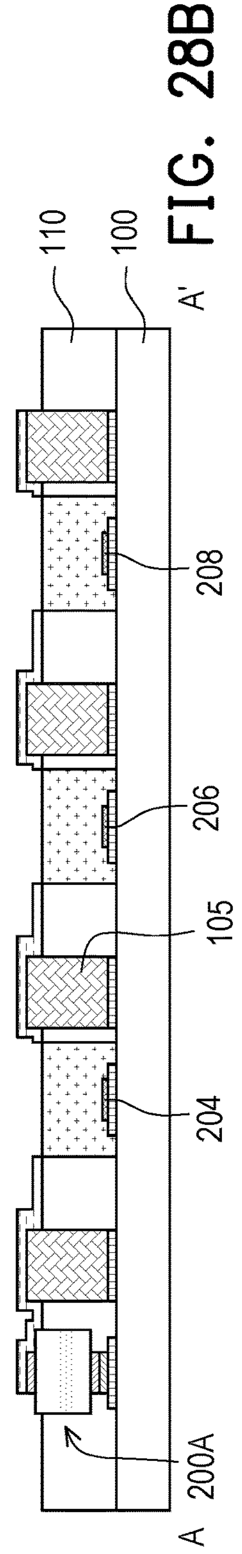
Figure 28C:
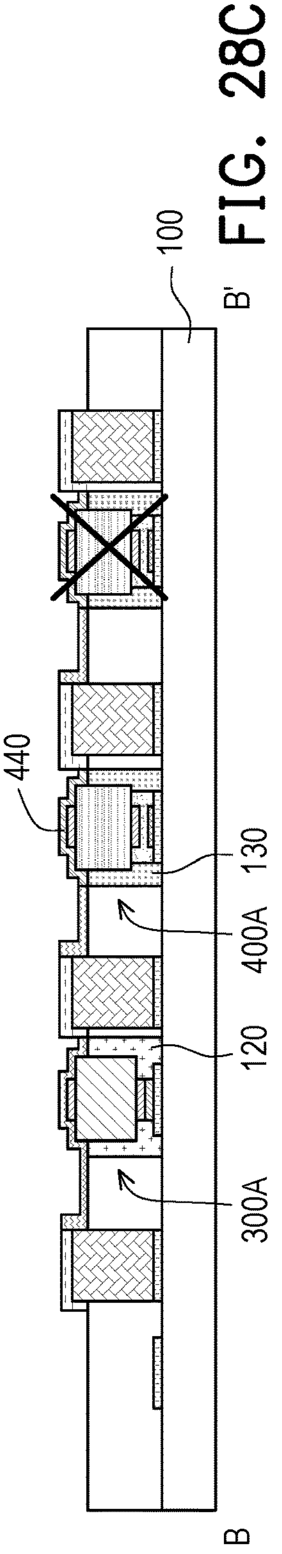

After the third interconnect structure 440 is formed, a display device 40" that has been repaired twice is obtained. The detection procedure is performed on the display device 40" that has been repaired twice to check whether the third light-emitting elements 400A are correctly bonded to the circuit substrate 100. Referring to FIGS. 28A to 28C, after the third interconnect structure 440 is formed, the sub-pixels in the display device 40" has been repaired twice are detected.

After the detection procedure, it is found that the third light-emitting elements 400A on the third sub-pixel PX3 are normally bonded to the circuit substrate 100, but the third light-emitting elements 400A on the fourth sub-pixel PX4 do not emit the light correctly.

Figures 29A, 29B, 29C:
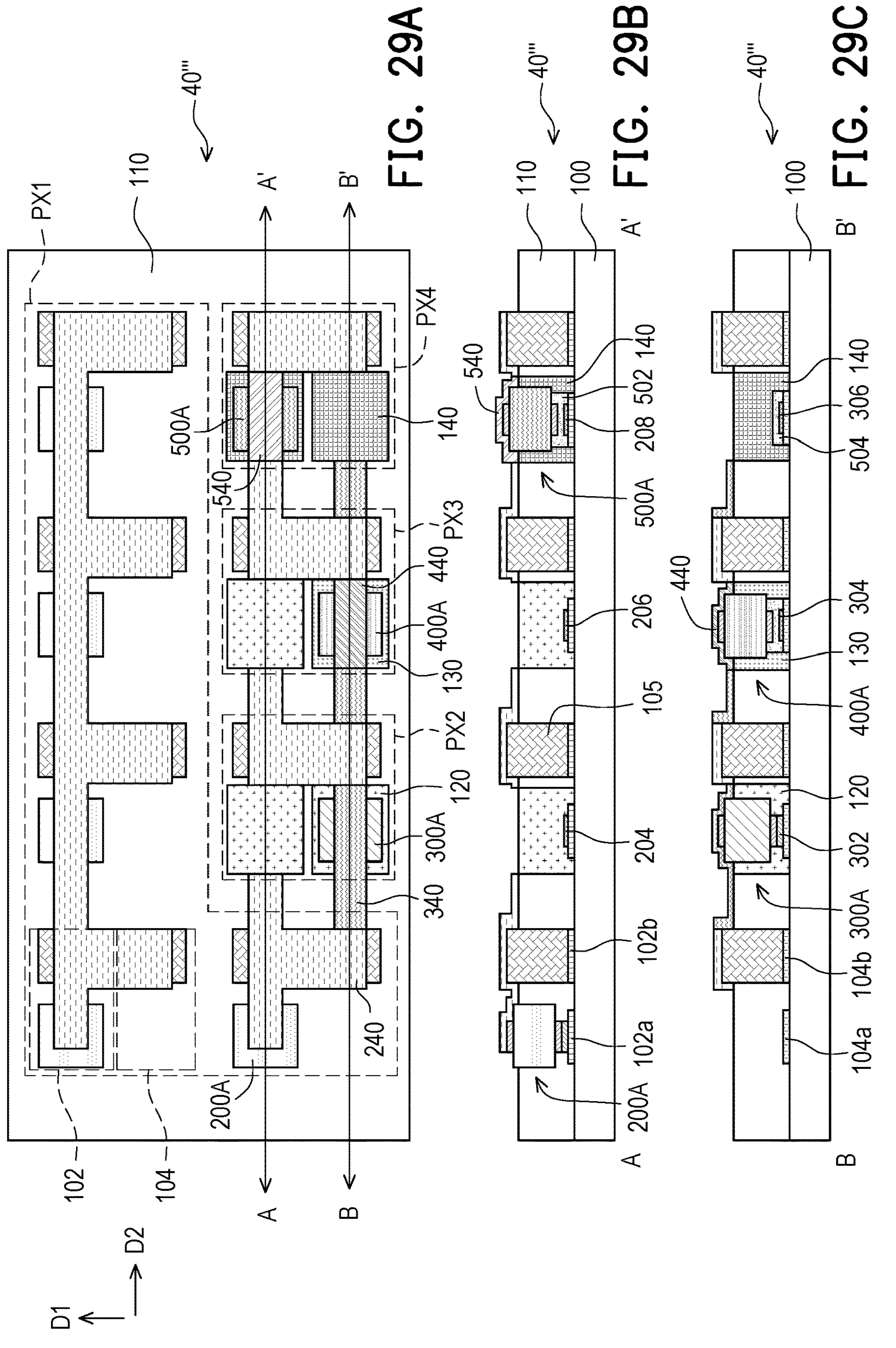

The repair process shown in FIGS. 29A to 29C will be performed on the faulty fourth sub-pixel PX4.

Referring to FIGS. 29A to 29C, the third light-emitting elements 400A on the second bonding area 104 of the fourth sub-pixel PX4 are removed.

In some embodiments, when the faulty third light-emitting elements 400A are removed, the second filling material 130 surrounding the faulty third light-emitting elements 400A is also removed. In some embodiments, when the second filling material 130 is removed, the third interconnect structure 440 located thereon is also completely or partially removed.

In some embodiments, the first filling material 120 in the fourth sub-pixel PX4 is removed to expose the first bonding area 102 of the fourth sub-pixel PX4.

Then, the fourth light-emitting elements 500A are disposed on the fourth sub-pixel PX4, and are bonded to the circuit substrate 100 through the second conductive adhesive structure 502. The first electrode 510 of the fourth light-emitting element 500A are electrically connected to the fourth sub-pixel PX4 of the circuit substrate 100 through the second conductive adhesive structure 502, for example, are electrically connected to the first pad 102*a*.

The third filling material 140 is formed between the fourth light-emitting element 500A and the flat layer 110. The fourth interconnect structure 540 is formed on the flat layer 110 and the third filling material 140. The fourth interconnect structure 540 is electrically connected to the fourth light-emitting element 500A and the conductive block 105.

After the fourth interconnect structure 540 is formed, the display device 40'" that has been repaired three times is obtained.

Based on the above, even if the pad (or the repair pad) includes the residual solder with the intermetallic compounds, the first conductive adhesive structure 402 may still be used to perform the second repair, or even the second conductive adhesive structure 502 may be used to perform the third repair. Therefore, more repair processes may be used to reduce defective pixels in the display device 40'".

What is claimed is:

1. A display device, comprising:

a circuit substrate having a first sub-pixel, a second sub-pixel, and a third sub-pixel, wherein each of the first sub-pixel, the second sub-pixel, and the third sub-pixel has a first bonding area and a second bonding area, and each of the first sub-pixel, the second sub-pixel, and the third sub-pixel comprises a plurality of pads;

a first light-emitting element located in the first bonding area of the first sub-pixel and bonded to the circuit substrate through a first solder structure;

a second light-emitting element located in the second sub-pixel; and a third light-emitting element located on one of the first bonding area and the second bonding area of the third sub-pixel and bonded to the circuit substrate through a first conductive adhesive structure, wherein a first residual solder is located between and connected to the first conductive adhesive structure and a portion of the plurality of pads of the third sub-pixel, and the first conductive adhesive structure comprises an anisotropic conductive film, a silver adhesive, or a conductive carbon adhesive.

2. The display device according to claim 1, wherein the second light-emitting element is located in the second bonding area of the second sub-pixel, and is bonded to the circuit substrate through a second solder structure, wherein there is a second residual solder on the first bonding area of the second sub-pixel.

3. The display device according to claim 2, wherein the third light-emitting element is disposed on the second bonding area of the third sub-pixel, there is a third residual solder on the first bonding area of the third sub-pixel, and there is the first residual solder separated from the third residual solder on the second bonding area of the third sub-pixel.

4. The display device according to claim 1, wherein the circuit substrate further includes a fourth sub-pixel, each of the first sub-pixel, the second sub-pixel, the third sub-pixel, and the fourth sub-pixel has the first bonding area and the second bonding area, and the display device further comprises:

a fourth light-emitting element located on one of the first bonding area and the second bonding area of the fourth sub-pixel and bonded to the circuit substrate through a second conductive adhesive structure, wherein there is a residual conductive adhesive on the other one of the first bonding area and the second bonding area of the fourth sub-pixel.

5. The display device according to claim 4, further comprising:

a fourth residual solder located on the first bonding area of the fourth sub-pixel; and a fifth residual solder located on the second bonding area of the fourth sub-pixel.

6. The display device according to claim 1, wherein in each of the first sub-pixel, the second sub-pixel, and the third sub-pixel, the first bonding area is located in a first direction of the second bonding area.

7. The display device according to claim 1, wherein the plurality of pads of each of the first sub-pixel, the second sub-pixel, and the third sub-pixel comprises a first pad, a second pad, a first repair pad, and a second repair pad that are separated from one another, wherein the first pad and the second pad are disposed in the first bonding area, and the first repair pad and the second repair pad are disposed in the second bonding area.

8. The display device according to claim 1, wherein the plurality of pads of each of the first sub-pixel, the second sub-pixel, and the third sub-pixel comprises a first pad and a second pad that are separated from each other, wherein the first pad extends continuously from the first bonding area to the second bonding area, and the second pad extends continuously from the first bonding area to the second bonding area.

9. The display device according to claim 1, further comprising:

- a flat layer located on the circuit substrate and surrounding the first light-emitting element and the second light-emitting element;
- a first interconnect structure located on the flat layer and electrically connected to the first light-emitting element; and
- a second interconnect structure located on the flat layer and electrically connected to the second light-emitting element.

10. The display device according to claim 9, wherein the first interconnect structure is connected to the second interconnect structure.

11. The display device according to claim 9, further comprising:

- a plurality of conductive blocks disposed in the first sub-pixel and the second sub-pixel, wherein the first interconnect structure is electrically connected to the first light-emitting element and at least one of the conductive blocks, and the second interconnect structure is electrically connected to the second light-emitting element and the first interconnect structure.

12. A manufacturing method of a display device, comprising:

- providing a circuit substrate, wherein the circuit substrate has a first sub-pixel, a second sub-pixel, and a third sub-pixel, each of the first sub-pixel, the second sub-pixel, and the third sub-pixel has a first bonding area and a second bonding area, and each of the first sub-pixel, the second sub-pixel, and the third sub-pixel comprises a plurality of pads;
- respectively disposing a plurality of first light-emitting elements on the first sub-pixel, the second sub-pixel, and the third sub-pixel, wherein one of the first light-emitting elements is disposed on the first bonding area of the first sub-pixel and is bonded to the circuit substrate through a first solder structure, and another ones of the first light-emitting elements are respectively disposed on the second sub-pixel and the third sub-pixel;
- removing the another ones of the first light-emitting elements and leaving a first residual solder on the first bonding area of the second sub-pixel, and leaving a second residual solder on the first bonding area of the third sub-pixel;
- respectively disposing a plurality of second light-emitting elements on the second sub-pixel and the third sub-pixel, wherein one of the second light-emitting elements is disposed on the second bonding area of the second sub-pixel and is bonded to the circuit substrate through a second solder structure, and another one of the second light-emitting elements is disposed on the third sub-pixel;
- removing the another one of the second light-emitting elements and leaving a third residual solder on the second bonding area of the third sub-pixel; and
- disposing a third light-emitting element on the third sub-pixel, wherein the third light-emitting element is connected to the circuit substrate through a first conductive adhesive structure, wherein at least one of the second residual solder and the third residual solder is located between and connected to the first conductive adhesive structure and a portion of the plurality of pads of the third sub-pixel, and the first conductive adhesive structure comprises an anisotropic conductive film, a silver adhesive, or a conductive carbon adhesive.

13. The manufacturing method according to claim 12, wherein the circuit substrate further comprises a fourth sub-pixel, wherein each of the first sub-pixel, the second sub-pixel, the third sub-pixel, and the fourth sub-pixel has the first bonding area and the second bonding area;

- respectively disposing the first light-emitting elements on the first sub-pixel, the second sub-pixel, the third sub-pixel, and the fourth sub-pixel, wherein the one of the first light-emitting elements is disposed on the first bonding area of the first sub-pixel, and the another ones of the first light-emitting elements are respectively disposed on the second sub-pixel, the third sub-pixel, and the fourth sub-pixel;
- removing the another ones of the first light-emitting elements and leaving a fourth residual solder on the first bonding area of the fourth sub-pixel;
- respectively disposing the second light-emitting elements on the second sub-pixel, the third sub-pixel, and the fourth sub-pixel, wherein the one of the second light-emitting elements is disposed on the second sub-pixel, and the another ones of the second light-emitting elements are respectively disposed on the third sub-pixel and the fourth sub-pixel;
- removing the another ones of the second light-emitting elements;
- respectively disposing the third light-emitting elements on the third sub-pixel and the fourth sub-pixel, wherein one of the third light-emitting elements is disposed on the third sub-pixel and bonded to the circuit substrate through the first conductive adhesive structure, and the another one of the third light-emitting elements is disposed on the fourth sub-pixel; and
- removing the another one of the third light-emitting elements and leaving a residual conductive adhesive on the fourth sub-pixel.

14. The manufacturing method according to claim 13, further comprising:

- disposing a fourth light-emitting element on the fourth sub-pixel, wherein the fourth light-emitting element is bonded to the circuit substrate through a second conductive adhesive structure.

15. The manufacturing method according to claim 14, further comprising:

- after respectively disposing the first light-emitting elements on the first sub-pixel, the second sub-pixel, the third sub-pixel, and the fourth sub-pixel, forming a flat layer to laterally surround the first light-emitting elements;
- forming at least one first interconnect structure on the flat layer, wherein the at least one first interconnect structure is electrically connected to the one of the first light-emitting elements;
- removing a first portion of the flat layer, wherein the first portion surrounds the another ones of the first light-emitting elements;
- removing a second portion of the flat layer to form a plurality of openings, wherein the openings are respectively located on the second sub-pixel, the third sub-pixel, and the fourth sub-pixel;
- respectively disposing the second light-emitting elements in the openings;

forming at least one second interconnect structure on the flat layer, wherein the at least one second interconnect structure is electrically connected to the one of the second light-emitting elements;

forming at least one third interconnect structure on the flat layer, wherein the at least one third interconnect structure is electrically connected to the one of the third light-emitting elements; and forming a fourth interconnect structure on the flat layer, wherein the fourth interconnect structure is electrically connected to the fourth light-emitting element.

16. The manufacturing method according to claim 15, further comprising:

forming a first filling material to be filled between the second light-emitting elements and the flat layer;

forming the at least one second interconnect structure on the flat layer and the first filling material;

removing at least a portion of the first filling material around the another ones of the second light-emitting elements;

forming a second filling material to be filled between the third light-emitting elements and the flat layer;

forming the at least one third interconnect structure on the flat layer and the second filling material;

removing at least a portion of the second filling material around the another one of the third light-emitting elements;

forming a third filling material to be filled between the fourth light-emitting element and the flat layer; and forming the fourth interconnect structure on the flat layer and the third filling material.

* * * * *